US006147630A

United States Patent [19]

Sasai et al.

[11] Patent Number: 6,147,630

[45] Date of Patent: Nov. 14, 2000

[54] SIGNAL CONVERSION PROCESSING APPARATUS

[75] Inventors: Toshihiro Sasai, Kyoto; Fumitaka Okamoto; Youichi Nakasone, both of Ibaraki, all of Japan

[73] Assignee: NuCore Technology Inc., Santa Clara, Calif.

[21] Appl. No.: 09/305,875

[22] Filed: May 5, 1999

[30] Foreign Application Priority Data

May 11, 1998 [JP] Japan .................................. 10-127926

[51] Int. Cl.[7] ....................................................... H03M 1/00

[52] U.S. Cl. .............................................................. 341/110

[58] Field of Search ..................................... 341/110, 122; 327/94

[56] References Cited

U.S. PATENT DOCUMENTS 5,614,854 3/1997 Kuga ....................................... 341/110

*Primary Examiner*—Brian Young

*Attorney, Agent, or Firm*—Townsend and Townsend and Crew LLP; Kenneth R. Allen

[57] ABSTRACT

A signal conversion processing apparatus for temporarily storing an input analog signal and processing the signal to generate a desired output signal includes nonvolatile semiconductor memory sections, an input control section, and a signal processing section. The nonvolatile semiconductor memory sections sequentially store the input analog signal on the basis of a predetermined first control signal in the form of an analog value. The input control section selects a nonvolatile semiconductor memory section, in which the analog signal is to be written, from the nonvolatile semiconductor memory sections on the basis of a predetermined second control signal. The signal processing section performs arithmetic processing of a plurality of analog data read out from the nonvolatile semiconductor memory sections to convert the analog data into a desired output signal in the form of an analog value.

10 Claims, 21 Drawing Sheets

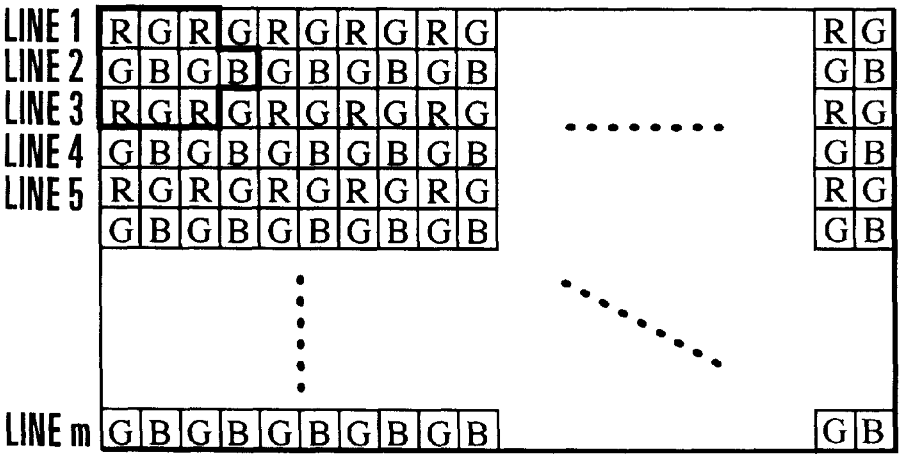
FIG. 12A
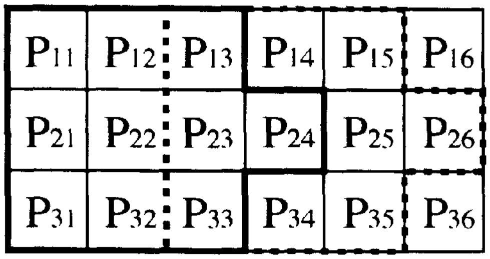
FIG. 12B
$$C_{22} = (P_{11} + P_{13} + P_{31} + P_{33})/4 \quad \cdots\cdots (1)$$
$$A_{22} = (P_{12} + P_{21} + P_{23} + P_{32})/4 \quad \cdots\cdots (2)$$
$$B_{23} = (P_{22} + P_{24})/2 \quad \cdots\cdots (3)$$
FIG. 12C Gout=0.5(-0.126f1+1.126f2+1.126f3-0.126f4)
=-0.063f1+0.563f2+0.563f3-0.063f4

Gout=0.25(-0.252f1+2.252f2+2.252f3-0.252f4)
=-0.063f1+0.563f2+0.563f3-0.063f4

| VERTICAL / HORIZONTAL | -2 | -1 | 0 | 1 | 2 |
|---|---|---|---|---|---|
| -2 | 0.052 | 0.052 | 0.052 | 0.052 | 0.052 |
| -1 | 0.052 | -0.1381 | -0.1381 | -0.1381 | 0.052 |
| 0 | 0.052 | -0.1381 | 0.6797 | -0.1381 | 0.052 |
| 1 | 0.052 | -0.1381 | -0.1381 | -0.1381 | 0.052 |
| 2 | 0.052 | 0.052 | 0.052 | 0.052 | 0.052 |

SIGNAL CONVERSION PROCESSING APPARATUS

BACKGROUND OF THE INVENTION

The present invention relates to a signal conversion processing apparatus and, more particularly to a signal conversion processing apparatus for temporarily storing an analog signal such as an image signal representing the luminance of each pixel of an image and processing the signal to generate a desired output signal.

An image signal obtained from an image sensing element such as a CCD is an analog signal formed by discretely plotting the luminance of pixels of an image on the time axis. Each luminance is represented by an analog value as the amplitude of the analog signal.

As the analog value, not only a value continuously changing but also a multilevel value changing stepwise is used.

To reconstruct image signals of the primary RGB colors (red, green, and blue) from an image signal obtained from an image sensing element having a color filter, the RGB luminance must be calculated for all omitted pixels by pixel interpolation.

For such signal processing, a signal conversion processing apparatus for temporarily storing an analog signal and processing the signal to generate a desired output signal is used.

To perform pixel interpolation of this type in a conventional digital camera system, an image signal obtained from an image sensing element is converted into a digital value by an A/D converter, and then, interpolation calculation is performed by program processing using an MPU or DSP.

On the other hand, in a full-analog camera system such as a video camera system, real-time pixel interpolation is performed for image signals of the respective colors basically using only addition and subtraction, and the signals are directly output to a display apparatus.

Image enlargement/reduction, distortion correction, spatial filter processing, and noise reduction are also included in image data processing. These processing operations can be regarded as interpolation for determining a new pixel (luminance) value.

In this case, for interpolation calculation, not only linear interpolation but also various methods such as a cubic convolution or B spline method using interpolation expressions of higher order can be used.

As convolution calculation for changing the image size, a separation scheme of calculation a one-dimensional convolution kernel in each of the vertical (Y) and horizontal (X) directions of an image or a scheme using direct action of a two-dimensional convolution kernel can be used.

In conversion of the luminance value of each pixel by white balance processing or gamma correction processing, once the value is quantized by A/D conversion, the density resolution is insufficient, and high-quality correction cannot be performed. Hence, in a conventional digital electronic camera system, after an image signal is converted into a digital value by a highly accurate A/D converter, the luminance value of each pixel is converted using predetermined conversion characteristics.

In such a conventional signal conversion processing apparatus, however, after an input analog signal is quantized by an A/D converter, arithmetic processing is performed using an MPU or a DSP to execute desired conversion processing. For this reason, if a processor with a considerably high processing speed is used, a large load is generated to lower the throughput of the entire signal conversion processing.

For example, when the above-described RGB pixel interpolation is performed for an image signal comprised of about 1,000,000 pixels, a calculation time of several sec to several ten sec is required even with a simple algorithm, i.e., linear interpolation from four nearest points.

Use of a higher-order interpolation algorithm increases the information processing amount in progression.

The clock rate of an MPU or DSP is limited. If the clock rate can be increased, memory circuits connected must also allow access at a higher speed, resulting in a large increase in cost.

To increase the processing capability, a plurality of MPUs or DSPs as interpolation calculators may be simultaneously operated, though this method poses problems of manufacturing cost, power consumption, and mounting space.

As the spatial resolution is improved by increasing the number of pixels, to increase the density resolution using the conventional digital processing method, the accuracy of quantization must be increased by increasing the number of conversion bits of an A/D converter. This increases the data processing load on all circuits in proportion to the conversion bit width.

In the above-described full-analog system, it is difficult to hold data for a long time to perform all pixel interpolation operations as analog processing. For example, data of about one line of an output from the image sensing element is held and delayed, and only a limited number of data of the next line are used for calculation. Hence, the range and method of interpolation are considerably limited.

SUMMARY OF THE INVENTION

The present invention has been made to solve the above problems, and has as its object to provide a signal conversion processing apparatus capable of performing desired conversion processing for an input analog signal at a high speed and high accuracy.

In order to achieve the above object, according to the present invention, there is provided a signal conversion processing apparatus for temporarily storing an input analog signal and processing the signal to generate a desired output signal, comprising a plurality of nonvolatile semiconductor memory sections for sequentially storing the input analog signal on the basis of a predetermined first control signal in the form of an analog value, an input control section for selecting a nonvolatile semiconductor memory section, in which the analog signal is to be written, from the nonvolatile semiconductor memory sections on the basis of a predetermined second control signal, and a signal processing section for performing arithmetic processing of a plurality of analog data read out from the nonvolatile semiconductor memory sections to convert the analog data into a desired output signal in the form of an analog value.

BRIEF DESCRIPTION OF THE DRAWINGS

FIGS. 12A, 12B, and 12C are explanatory views showing an example of luminance interpolation for an image signal;

DESCRIPTION OF THE PREFERRED EMBODIMENT

The present invention will be described next with reference to the accompanying drawings.

Figure 1:
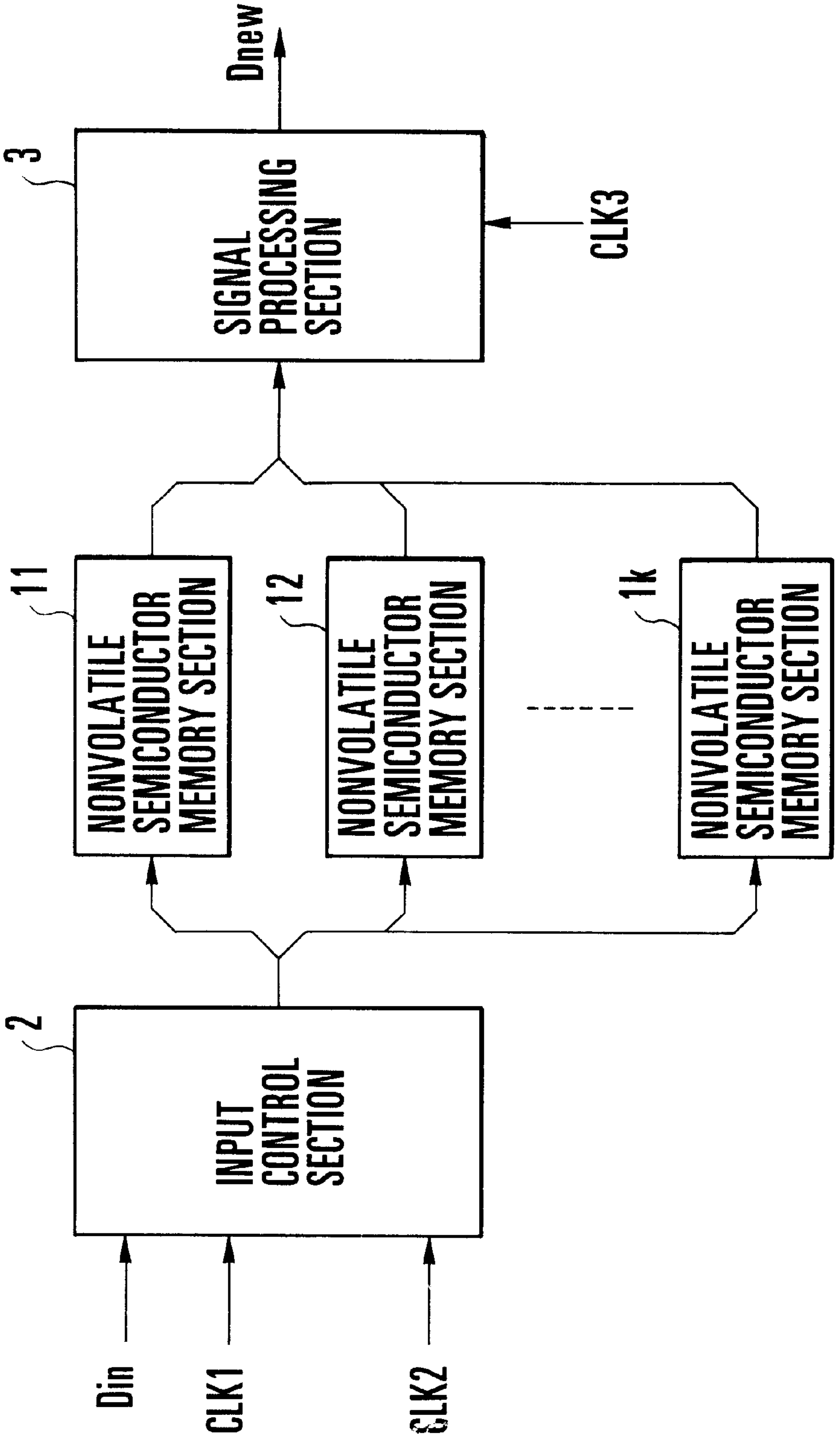
FIG. 1 is a block diagram showing a signal conversion processing apparatus according to an embodiment of the present invention.

FIG. 1 shows a signal conversion processing apparatus according to an embodiment of the present invention.

A description will be given below assuming that an input analog signal Din contains a number of analog amplitude values continuously plotted on the time axis in a predetermined order.

The signal conversion processing apparatus of the present invention performs predetermined arithmetic processing using a plurality of analog amplitude values, i.e., analog data in the analog signal Din to sequentially generate new analog data and outputs them as a new analog signal.

Referring to FIG. 1, k (k is an integer: k≧2) nonvolatile semiconductor memory sections 11 to 1k are parallelly arranged in correspondence with the input analog signal Din.

The analog signal Din is written in one of the nonvolatile semiconductor memory sections 11 to 1k, which is selected by an input control section 2, and stored as analog data in the form of an analog value.

As the analog value, not only a value continuously changing but also a multilevel value changing stepwise is used.

In this case, the semiconductor memories 11 to 1k sequentially store, as analog data, the amplitude values of the analog signal Din at timings based on a predetermined control signal CLK1 (first control signal) input together with the analog signal.

The nonvolatile semiconductor memory sections 11 to 1k can be formed on different semiconductor chips or one semiconductor chip.

The input control section 2 controls switching between the nonvolatile semiconductor memories 11 to 1k at timings based on a predetermined control signal CLK2 (second control signal), thereby select a nonvolatile semiconductor memory in which the analog signal is to be written.

A signal processing section 3 sequentially reads out a plurality of analog data from one or more nonvolatile semiconductor memory sections at timings based on a predetermined control signal CLK3, performs predetermined arithmetic processing, e.g., analog product-sum operation for these analog data to convert the analog signal Din into a new analog signal Dnew in the form of an analog value, and outputs the analog signal Dnew.

Analog data may be read out from some of the nonvolatile semiconductor memory sections 11 to 1k, or a plurality of analog data may be read out from one nonvolatile semiconductor memory section.

A buffer for temporarily storing analog data may be inserted such that analog calculation corresponding to desired signal conversion processing can be performed by any combination of plural readout analog data.

As described above, in the present invention, the plurality of nonvolatile semiconductor memory sections 11 to 1k are parallelly arranged in correspondence with the input analog signal Din. Each analog data is stored in one nonvolatile semiconductor memory section in the form of an analog value. After this, the plurality of analog data are read out, and predetermined analog arithmetic processing is performed to generate new analog data, thereby outputting the new analog signal Dnew.

This allows batch processing of a number of relatively complex analog calculations. Hence, the throughput of signal conversion processing can be improved as compared to the prior art in which an analog signal is quantized into digital data, and digital arithmetic processing is performed for the resultant digital data using an MPU or a DSP to generate a desired signal.

In addition, since neither expensive A/D converter with a large bit width nor MPU or DSP capable of highly accurate arithmetic processing need be used to reduce quantization noise, highly accurate signal conversion processing can be realized at relatively low cost.

Next, sections of the above-described signal conversion processing apparatus (FIG. 1) will be described.

Figure 2:
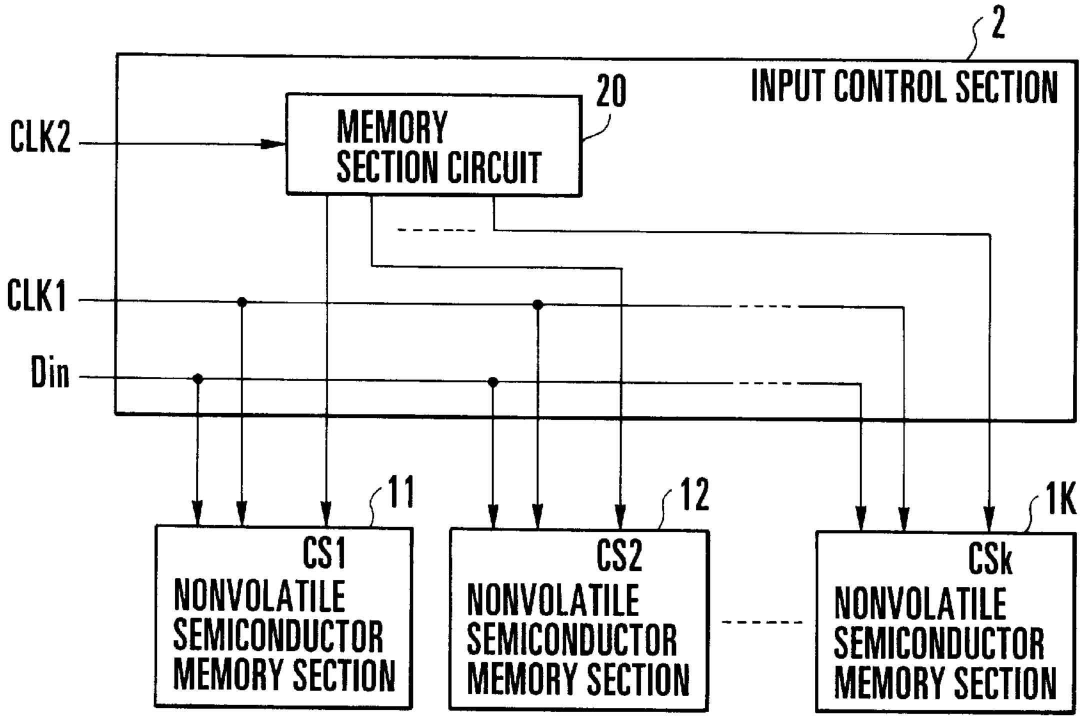
FIG. 2 is a block diagram showing the arrangement of an input control section.

FIG. 2 shows the input control section. The input control section 2 has a memory selection circuit 20 for outputting selection signals (chip select signals) CS1 to CSk for selecting the nonvolatile semiconductor memory sections 11 to 1k on the basis of the control signal CLK2.

The analog signal Din and control signal CLK1 are commonly supplied to the nonvolatile semiconductor memory sections 11 to 1k. The analog signal Din is written in nonvolatile semiconductor memory sections selected by the selection signals CS1 to CSk on the basis of the control signal CLK1.

Figure 3:
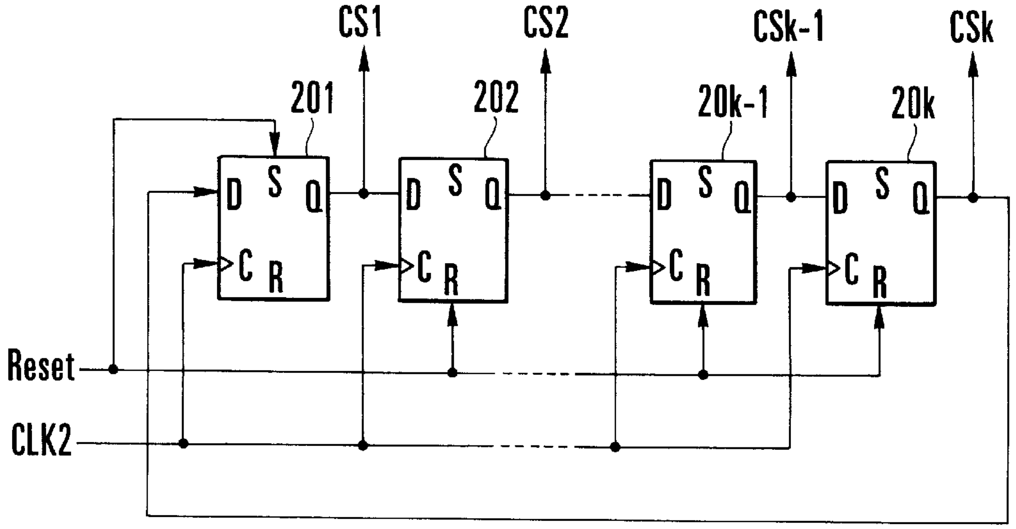
FIG. 3 is a block diagram showing the arrangement of a memory selection circuit.

FIG. 3 shows the arrangement of the memory selection circuit 20.

In this circuit, k latches 201 to 20k are connected in series. Outputs Q from the latches 201 to 20k shift at the leading edge of the control signal CLK2 as a clock.

Hence, only the output Q, i.e., the selection signal CS1 from the latch 201 is activated (high level) in response to a reset signal Reset. One of the selection signals is activated in response to the subsequently input control signal CLK2 in the order of CS2 to CSk, CS1 . . . , to select one of the nonvolatile semiconductor memory sections 11 to 1k.

Figure 4:
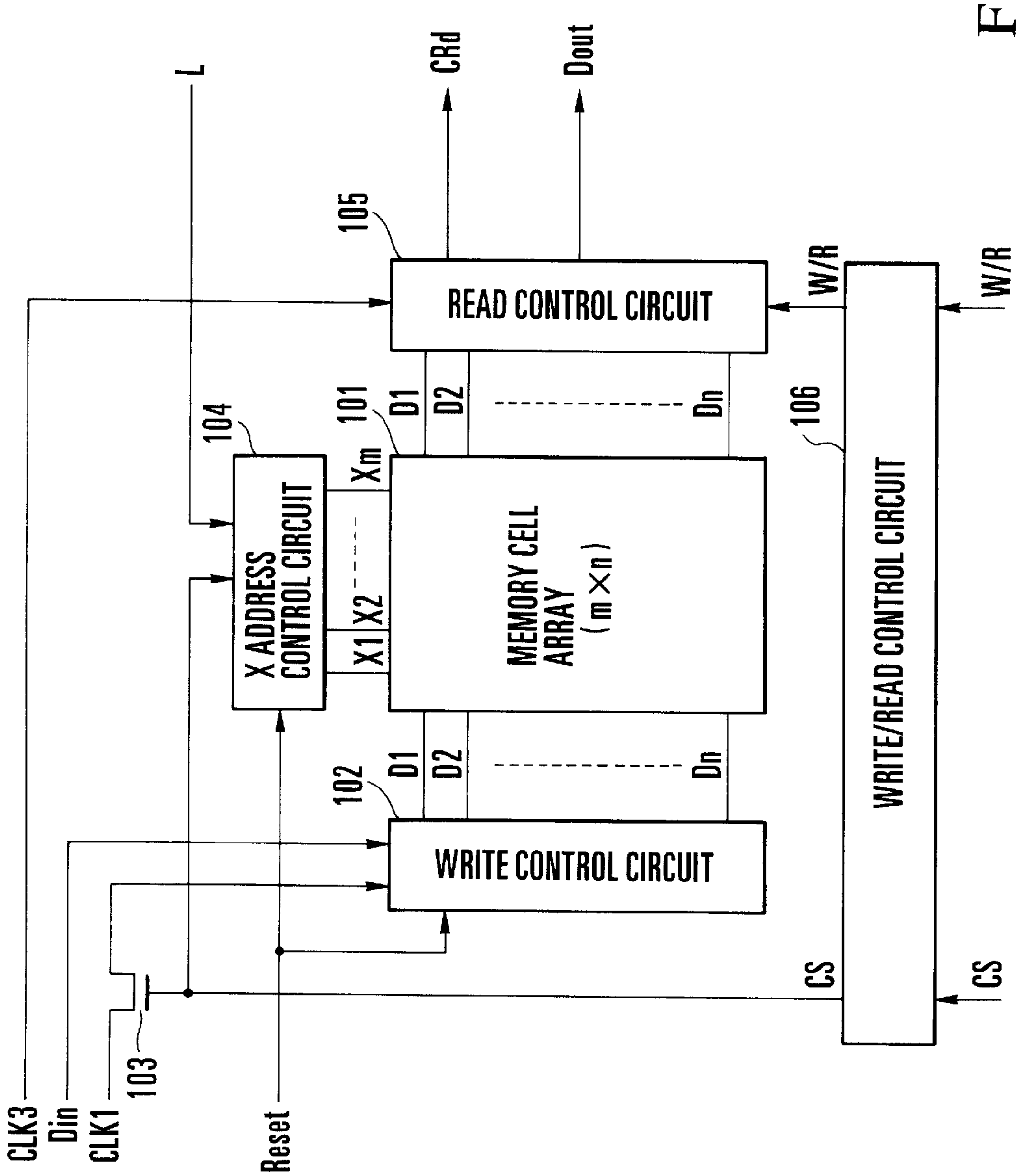
FIG. 4 is a block diagram showing the arrangement of a nonvolatile semiconductor memory section.

FIG. 4 shows the arrangement of the nonvolatile semiconductor memory. The nonvolatile semiconductor memory comprises a memory cell array 101 having m×n (m and n are integers: m and n≧2) analog memory cells, a write control circuit 102 for parallelly supplying the analog signal Din to the memory cell array 101 as analog data D1 to Dn on the basis of the control signal CLK1, and a read control circuit 105 for outputting the analog data D1 to Dn parallelly read out from the memory cell array 101 as a serial analog signal Dout on the basis of the control signal CLK3.

The nonvolatile semiconductor memory also has an X address control circuit 104 for supplying X address signals X1 to Xm to the memory cell array 101 on the basis of a selection signal CS supplied in a write operation or a line shift signal L supplied in a read operation.

One of the X address signals X1 to Xm is activated to select n cells of the memory cell array 101.

When a write control signal W/R represents write operation, the analog data D1 to Dn from the write control circuit 102 are written in n cells selected by one of the X address signals X1 to Xm.

On the other hand, when the write control signal W/R represents read operation, the analog data D1 to Dn are read out from n cells selected by one of the X address signals X1 to Xm to the read control circuit 105.

For the control signal CLK1 supplied to the write control circuit 102, a switch (FET) 103 is connected in series and controlled by the selection signal CS.

The output of the selection signal CS supplied to the switch 103 and X address control circuit 104 is controlled by a write/read control circuit 106 on the basis of the write control signal W/R.

A circuit section associated with the write operation will be described below in detail.

Figure 5:
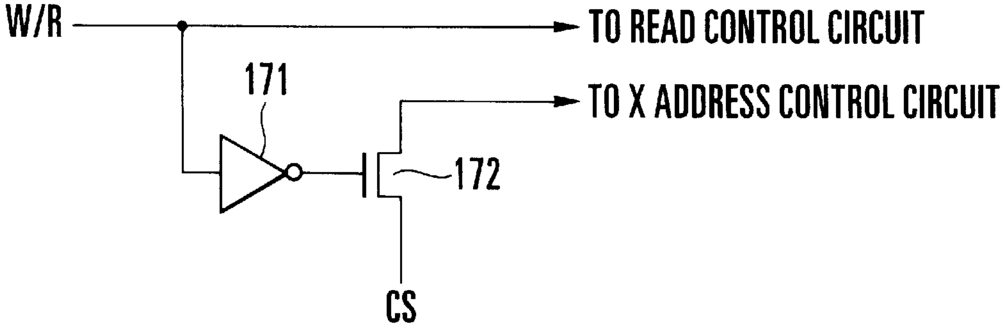
FIG. 5 is a circuit diagram showing the arrangement of a write/read control circuit.

FIG. 5 shows the arrangement of the write/read control circuit. Only when the write control signal W/R is inactive (Low level), i.e., only in the write operation, a switch (FET) 172 is turned on by an inverter 171 to supply the selection signal CS to the switch 103 and X address control circuit 104.

Hence, only when the selection signal CS for selecting a corresponding nonvolatile semiconductor memory section is active, and the write control signal W/R represents the write operation, the control signal CLK1 is supplied to the write control circuit 102 to output the analog signal Din as the analog data D1 to Dn.

Figure 6:
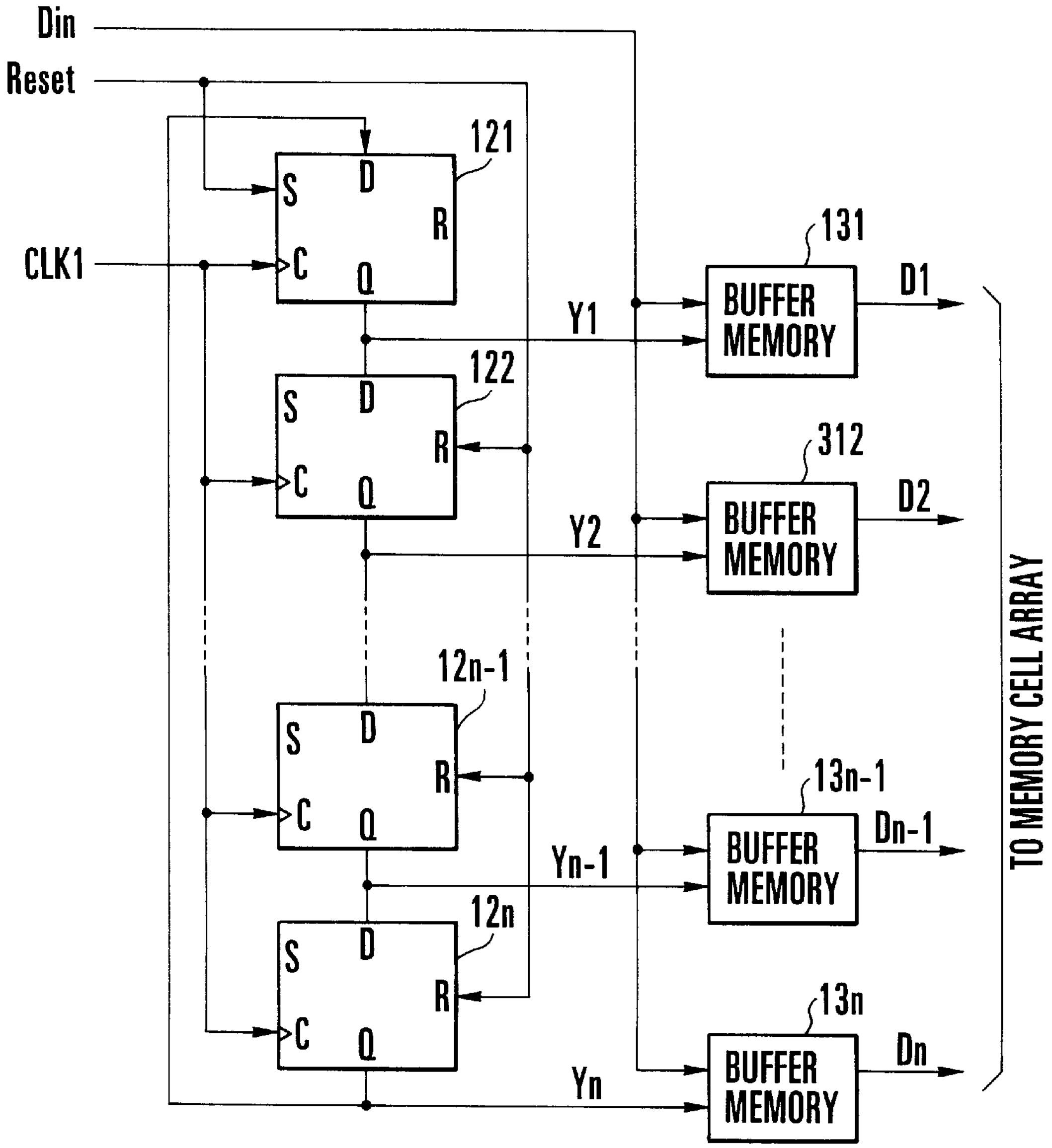
FIG. 6 is a block diagram showing the arrangement of a write control circuit.

FIG. 6 shows the arrangement of the write control circuit. In this circuit, n latches 121 to 12n are connected in series. Outputs Q from the latches 121 to 12n shift at the leading edge of the control signal CLK1 as a clock.

Hence, only the output Q, i.e., a Y address signal Y1 from the latch 121 is activated (high level) in response to the reset signal Reset. One of the Y address signals is activated in response to the subsequently input control signal CLK1 in the order of Y2 to Yn, Y1 . . .

For the analog signal Din, n buffer memories 131 to 13n are parallelly arranged to hold the amplitude values of the analog signal Din at timings of the Y address signals Y1 to Yn as analog values.

Figure 7:
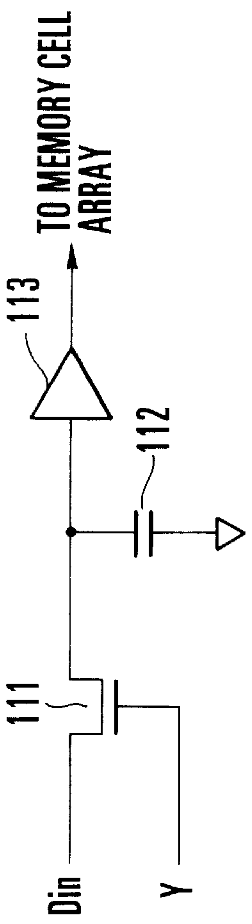
FIG. 7 is a circuit diagram showing the arrangement of a buffer memory.

FIG. 7 shows the arrangement of the buffer memory. The analog signal Din is input to a capacitive element 112 through a switch (FET) 111 which is turned on only when the Y address signal Y is active, and output from a buffer 113 as analog data with low impedance.

Figure 8:
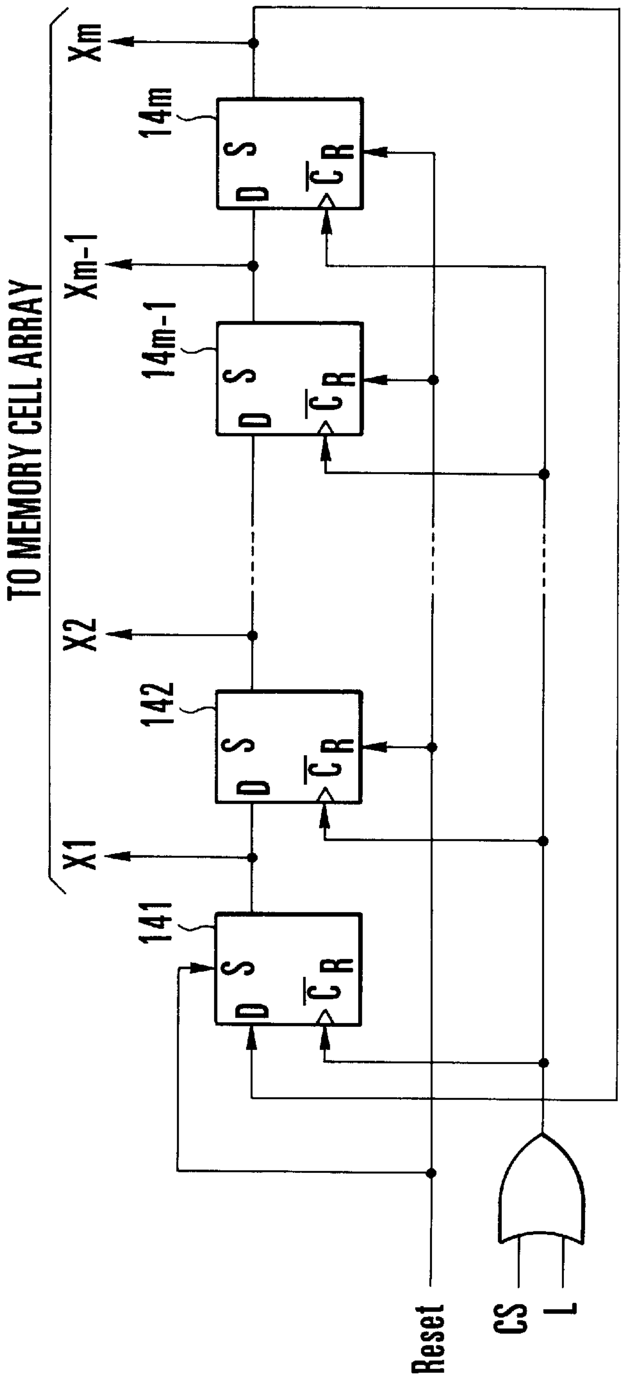
FIG. 8 is a block diagram showing the arrangement of an X address control circuit.

FIG. 8 shows the arrangement of the X address control circuit. In this circuit, m latches 141 to 14m are connected in series. Outputs Q from the latches 141 to 14m shift at the trailing edge of the OR output of the selection signal CS and line shift signal L as a clock.

Hence, only the output Q, i.e., the X address signal X1 from the latch 141 is activated (high level) in response to the reset signal Reset. One of the X address signals is activated in response to the subsequently input selection signal CS or line shift signal L in the order of X2 to Xn, X1 . . .

The write operation in the nonvolatile semiconductor memory sections will be described next with reference to FIG. 9.

Figure 9:
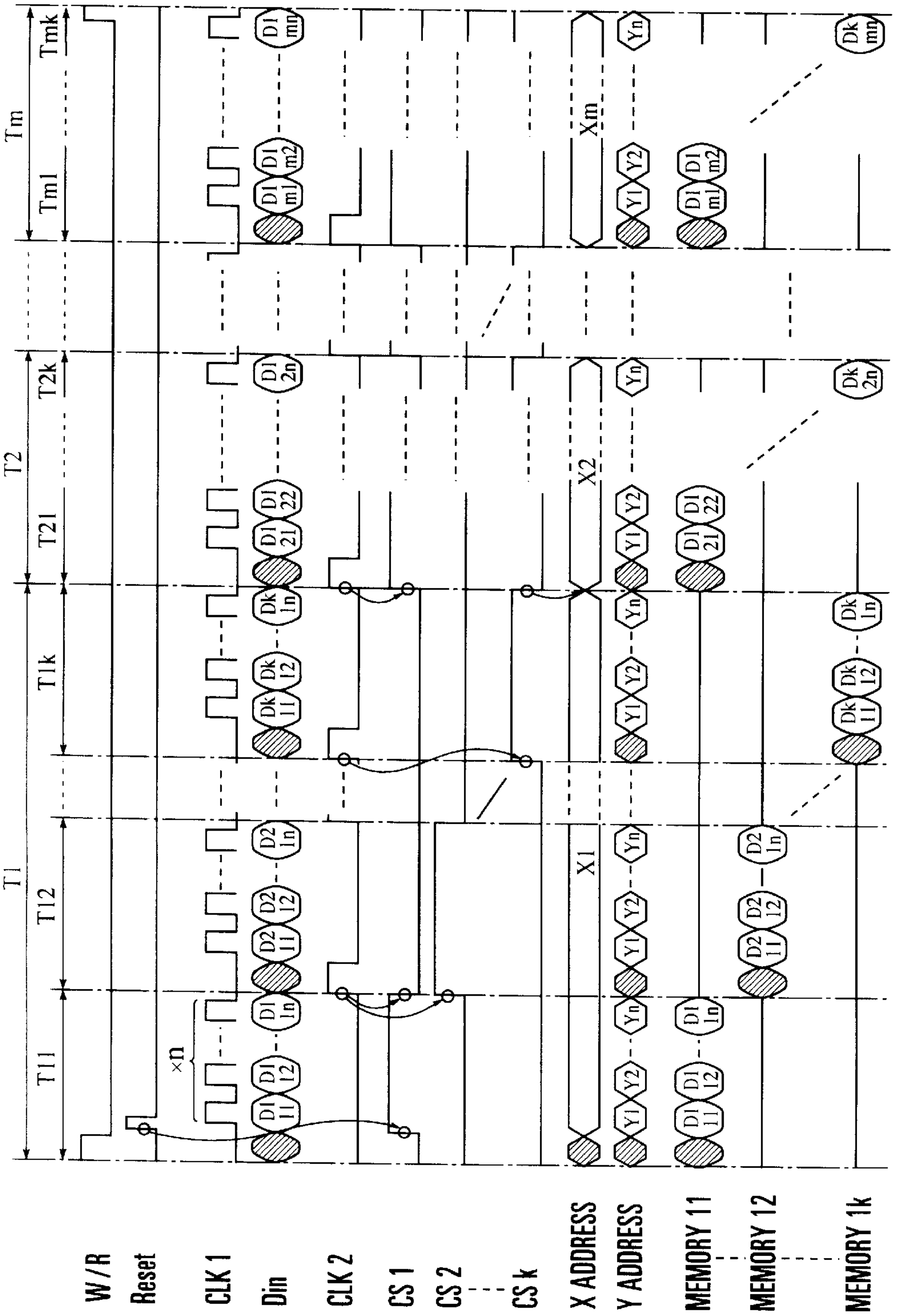
FIG. 9 is a timing chart showing the write operation of the present invention.

FIG. 9 shows the write operation.

In a period T11 of a period T1, the write control signal W/R is inactivated (low level), and the reset signal Reset is output.

In response to this, the selection signal CS1 is output from the memory selection circuit 20 of the above-described input control section 2 to select the nonvolatile semiconductor memory section 11.

In the nonvolatile semiconductor memory section 11 (FIG. 4), the selection signal CS1 is output from the write/read control circuit 106 to the switch 103, and the control signal CLK1 is supplied to the write control circuit 102.

In the write control circuit 102 (FIG. 6), the analog signal Din is sequentially input to the buffer memories 131 to 13n on the basis of the Y address signals Y1 to Yn generated from the control signal CLK1 and held and output to the memory cell array 101 as the analog data D1 to Dn.

The X address control circuit 104 activates the X address signal X1 on the basis of the selection signal CS from the write/read control circuit 106.

With this operation, analog data D111 to D11n of the analog signal Din, which are defined by the control signal CLK1, are written in n cells with address X1 of the memory cell array 101 in the nonvolatile semiconductor memory section 11.

In a period T12, only the selection signal CS2 is activated in correspondence with the leading edge of the control signal CLK2 to select the nonvolatile semiconductor memory section 12. As in the period T11, analog data D211 to D21n of the analog signal Din, which are defined by the control signal CLK1, are written in the memory cell array 101 of the nonvolatile semiconductor memory section 12.

In this case as well, the X address control circuit 104 of the nonvolatile semiconductor memory section 12 activates only the X address signal X1, as in the period T11, because the selection signal CS2 is the first selection signal CS for the section from the Reset output point, and the analog data D211 to D21n are written in n cells having the address X1.

In this way, from the period T11 to T1k, the analog signal Din is written in cells having the address X1 in the nonvolatile semiconductor memory sections 11 to 1k.

In the subsequent period T2, since the selection signals CS input to the X address control circuits 104 of the nonvolatile semiconductor memory sections 11 to 1k are the second selection signals CS from the Reset output point, only the X address signal X2 is activated, and the analog signal Din is written in n cells having the address X2.

In this fashion, from the period T1 to Tm, the X address sequentially changes on the basis of the selection signal CS, and the analog signal Din is written at the corresponding address.

Actually, for example, when an image signal output from an image sensing section such as a CCD is input as the analog signal Din, a horizontal sync signal supplied in synchronism with each pixel is used as the control signal CLK1, and a vertical sync signal supplied in synchronism with each horizontal line is used as the control signal CLK2.

The nonvolatile semiconductor memory sections 11 to 1k are switched and selected on the basis of the vertical sync signal. A luminance value (analog data) of one horizontal line of the image signal is written in cells having the same X address in one nonvolatile semiconductor memory section.

As will be described later, to perform interpolation between pixels of a plurality of adjacent horizontal lines, the luminance values of pixels of the respective horizontal lines are read out from a plurality of nonvolatile semiconductor memory sections and interpolated.

With the above-described write method, one horizontal line data is written in cells having the same X address. By improving the arrangement of the memory cell array or addressing method, data which does not accurately correspond to one horizontal line may be written in cells having the same X address.

For example, analog data of two horizontal lines or ½ horizontal line may be written in cells having the same X address.

With this arrangement, the nonvolatile semiconductor memory sections or their memory cell arrays can be flexibly designed, and the occupied area on a semiconductor chip can be optimized.

The method of sequentially writing the analog signal Din in the plurality of nonvolatile semiconductor memory sections is not limited to the above-described method, and any other method can be used to write the analog signal Din.

For example, a method of writing an analog signal of this type at a higher speed is disclosed in Japanese Patent Application No. 9-307183, and this method may be used.

A circuit section associated with the read operation of the nonvolatile semiconductor memory section will be described next in detail.

Figure 10:
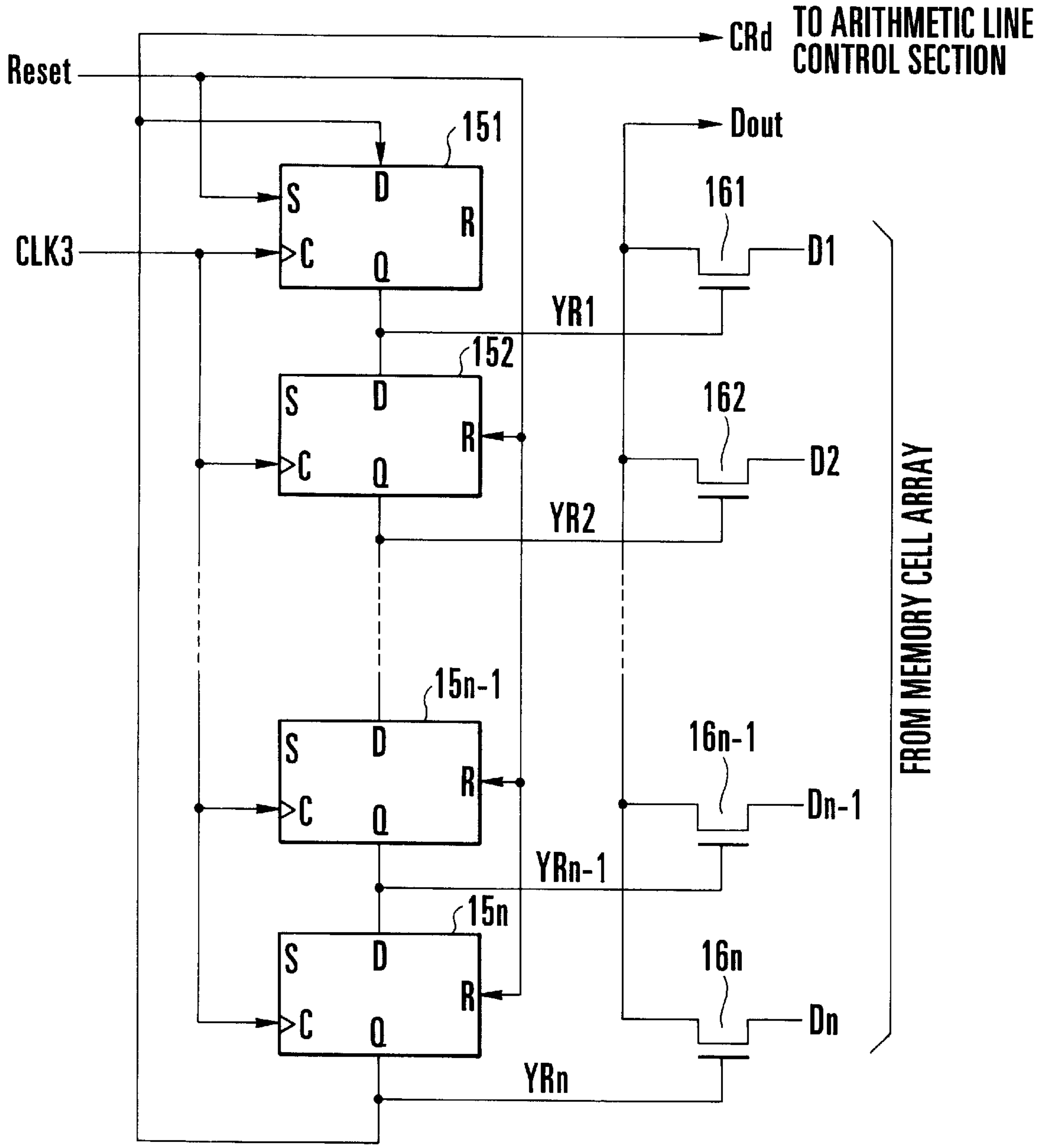
FIG. 10 is a block diagram showing the arrangement of a read control circuit.

FIG. 10 shows the arrangement of the read control circuit. In this circuit, n latches 151 to 15n are connected in series. Outputs Q from the latches 151 to 15n shift at the leading edge of the control signal CLK3 as a clock.

Hence, only the output Q, i.e., the Y address signal YR1 from the latch 151 is activated (high level) in response to the reset signal Reset. One of the Y address signals is activated in response to the subsequently input control signal CLK3 in the order of YR2 to YRn, YR1 . . .

For the analog data D1 to Dn read out from the memory cell array 101, switches (FETs) 161 to 16n are connected in series. The switches 161 to 16n are turned on one by one on the basis of the Y address signals YR1 to YRn to output the analog data D1 to Dn to the terminal Dout as a serial analog signal.

A control signal CRd is the output Q, i.e., Y address signal YRn from the latch 15n, which is activated when the analog data D1 to Dn are output. The control signal CRd is supplied to the signal processing section 3 (to be described later).

The analog signal Dout read out from the nonvolatile semiconductor memory sections 11 to 1k is supplied to the signal processing section 3 (FIG. 1).

Figure 11:
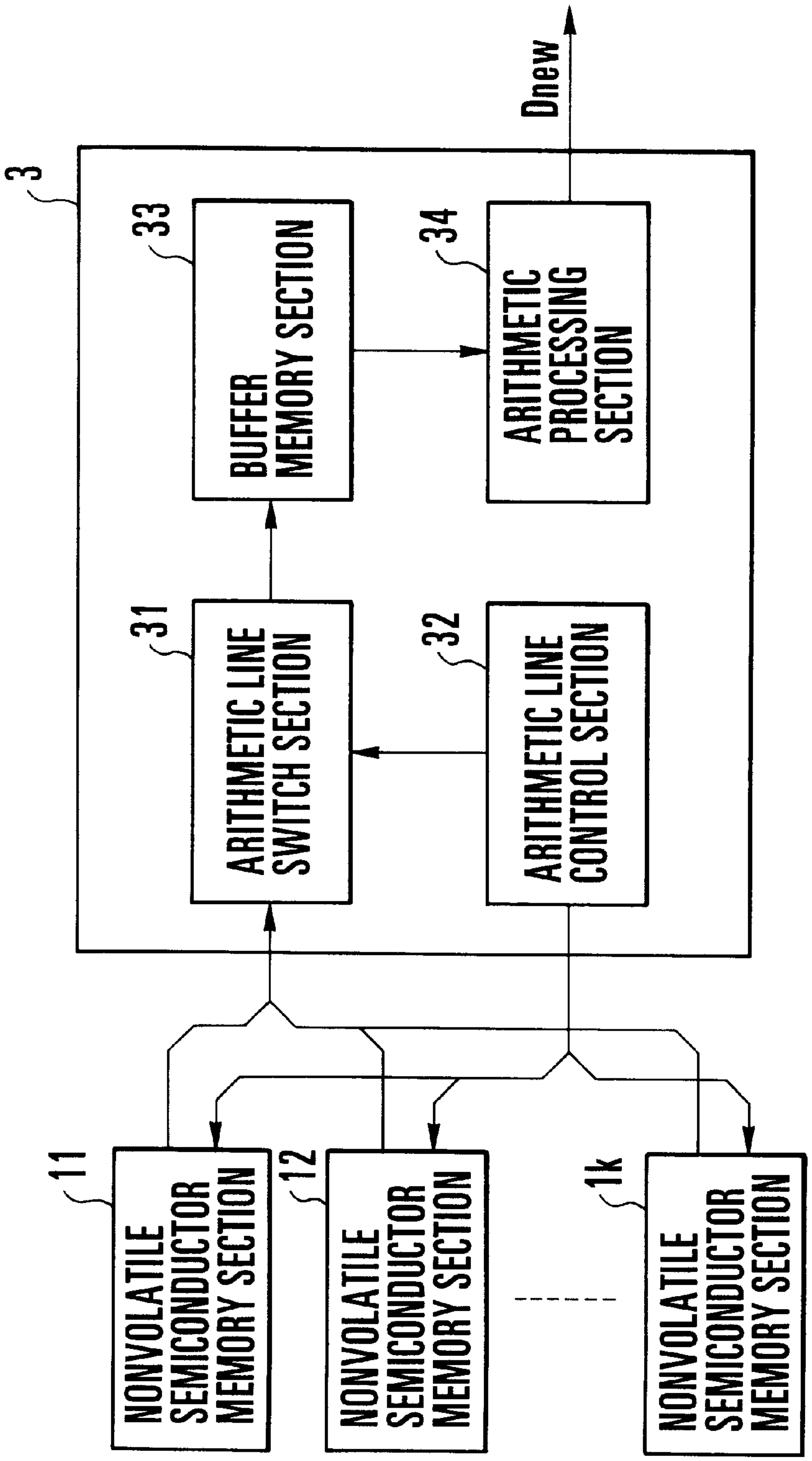
FIG. 11 is a block diagram showing the arrangement of a signal processing section.

FIG. 11 shows the arrangement of the signal processing section. An arithmetic line switch section 31 selectively outputs the analog signals Dout read out from the nonvolatile semiconductor memory sections 11 to 1k under the control of an arithmetic line control section 32. The analog signals Dout are stored in predetermined buffers of a buffer memory section 33 on the output side as analog data.

The analog data stored in the buffers of the buffer memory section 33 are read out by an arithmetic processing section 34. Predetermined arithmetic processing, e.g., product-sum operation is performed for a plurality of analog data.

With this processing, new analog data is sequentially generated and output as the converted analog signal Dnew.

FIGS. 12A, 12B, and 12C show an example of luminance interpolation for an image signal, in which FIG. 12A shows a pixel arrangement based on the Bayer matrix, FIG. 12B shows its main portion, and FIG. 12C shows linear interpolation expressions.

In the Bayer matrix, as shown in FIG. 12A, RGB color filters with the respective colors are arranged in a checker pattern in units of pixels. Each pixel represents the luminance of one of the RGB colors.

In this example, the first horizontal line 1 represents luminance values of "R, G, R, G, . . . " from the left end. The next horizontal line 2 represents luminance values of "G, B, G, B, . . . " from the left end.

FIG. 12B shows the luminance values of pixels of the main portion (indicated by the bold frame). For example, a pixel P11 represents the luminance of the leftmost pixel of horizontal line 1, i.e., R (red) luminance value. A pixel P22 represents the luminance of the second pixel from the left end of horizontal line 2, i.e., B (blue) luminance value.

To linearly interpolate the R luminance value at the position P22 from R pixels in the vicinity, equation (1) shown in FIG. 12C is used.

More specifically, the average luminance value of four R pixels P11, P13, P31, and P33 around the pixel P22 is obtained and used as an R (red) luminance value C22 at the position P22.

In a similar manner, a G (green) luminance value A22 at the position P22 is obtained using equation (2), and a B (blue) luminance value B23 at a position P23 is obtained using equation (3).

These equations can be generally used in correspondence with relative positions in the area indicated by the bold frame in FIG. 12B.

For example, when the bold frame is shifted to the right by two pixels up to the bold broken frame, the R (red) luminance value at a position P24 can be obtained from equation (1).

Hence, when linear interpolation is to be performed on the basis of equations (1) to (3), the luminance values (analog data) of a horizontal line containing the pixel to be interpolated and horizontal lines on the upper and lower sides of the horizontal line, i.e., a total of three horizontal lines are parallelly read out.

The read operation of the nonvolatile semiconductor memory section will be described next with reference to FIG. 13.

Figure 13:
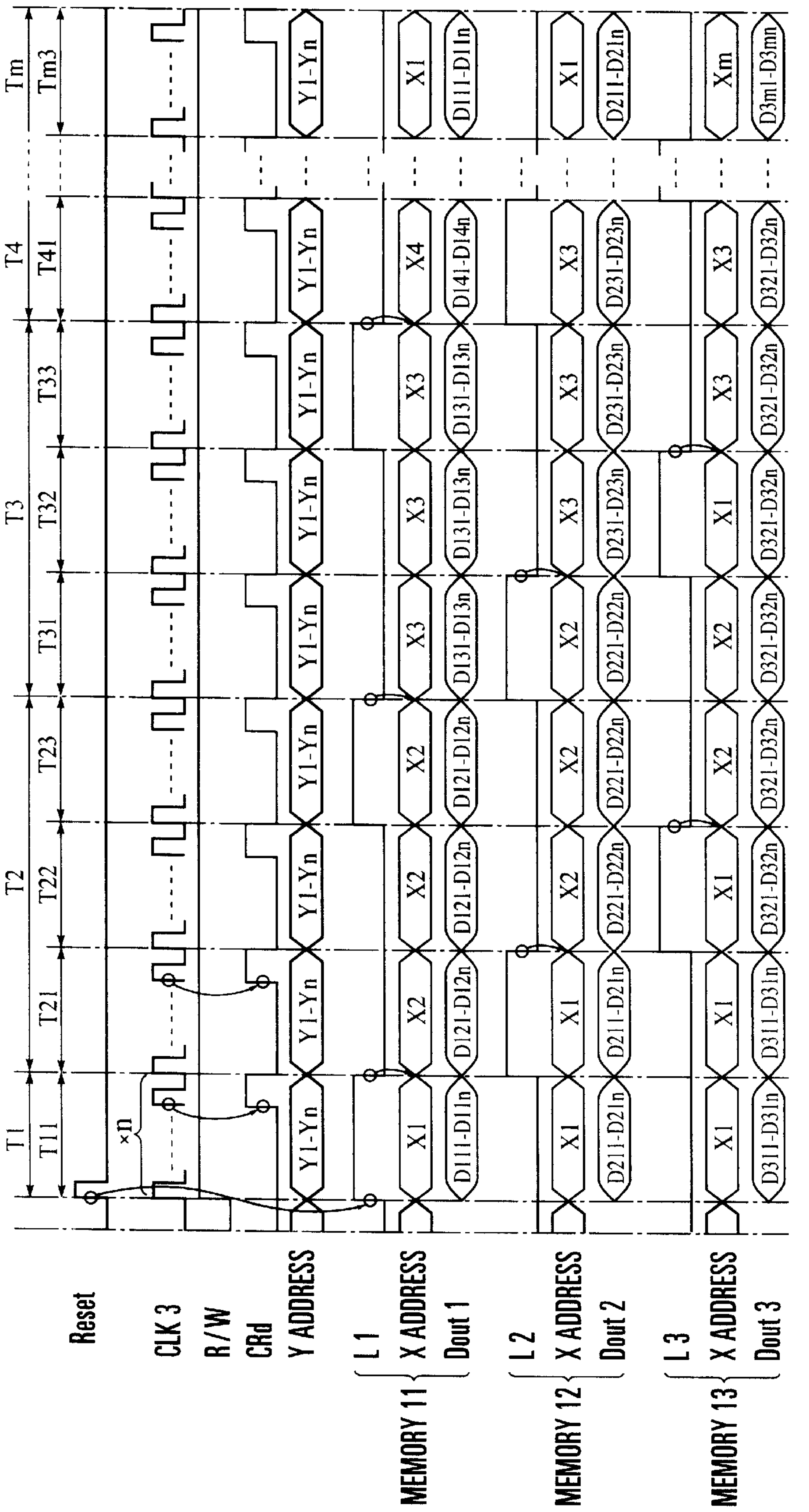
FIG. 13 is a timing chart of the read operation of the present invention.

FIG. 13 shows the read operation. In this case, analog data are almost simultaneously read out from the three (k=3) nonvolatile semiconductor memories 11 to 13 in parallel.

At the start of the period T1, the reset signal Reset is output, and the write control signal W/R is activated (high level).

In response to this, a line shift signal L1 from the arithmetic line control section (to be described later) is activated and supplied to the nonvolatile semiconductor memory 11.

In the nonvolatile semiconductor memory 11, the X address control circuit 104 (FIG. 4) activates only the X address signal X1 on the basis of the reset signal Reset.

Additionally, in the read control circuit 105 (FIG. 10), one of the Y address signals YR1 to YRn is sequentially activated on the basis of the control signal CLK3.

Hence, the analog data D111 to D11n are read out from n cells with address X1 in the memory cell array 101 and sequentially output as an analog signal Dout1.

In the same way, in the nonvolatile semiconductor memory sections 12 and 13 as well, only the X address signal X1 is activated in response to the reset signal Reset, and the analog data D211 to D21n and D311 to D31n are read out from n cells having the address X1 and sequentially output as analog signals Dout2 and Dout3.

In the read control circuit 105 of the nonvolatile semiconductor memory section 11, the control signal CRd is activated (high level) at the leading edge of the final control signal CLK3 in the period T1 and output to the arithmetic line control section (to be described later).

With this operation, at the start of a period T21 of the next period T2, the line shift signal L1 is inactivated, and only a line shift signal L2 is activated.

The X address control circuit 104 of the nonvolatile semiconductor memory section 11 activates only the X address signal X2 in correspondence with the trailing edge of the line shift signal L1. In the period T21, analog data are read out from n cells having the address X2.

In the nonvolatile semiconductor memory sections 12 and 13, the trailing edges of the line shift signals L2 and L3 are not input. For this reason, only the X address signal X1 is continuously activated, and the same analog data as those in the period T1 are read out.

For example, when horizontal lines 1, 4, . . . in FIG. 12A are stored in the nonvolatile analog memory 11, horizontal lines 2, 5, . . . are stored in the nonvolatile analog memory 12, and horizontal lines 3, 6, . . . are stored in the nonvolatile analog memory 13, horizontal lines 1 to 3 are parallelly read out in the period T11, and horizontal lines 2 to 4 are read parallelly out in the period T21.

In the above-described manner, on the basis of the control signal CRd representing completion of the read of one horizontal line, one of the line shift signals L1 to L3 is sequentially activated to sequentially read out data of three adjacent horizontal lines in parallel.

The method of sequentially reading out analog data from the plurality of nonvolatile semiconductor memory sections is not limited to the above-described method, and any other method can be used to read out the analog data.

For example, a method of reading out an analog signal of this type at a higher speed is disclosed in Japanese Patent Application No. 9-339710, and this method may be used.

Next, portions of the signal processing section will be described in detail.

Figure 14:
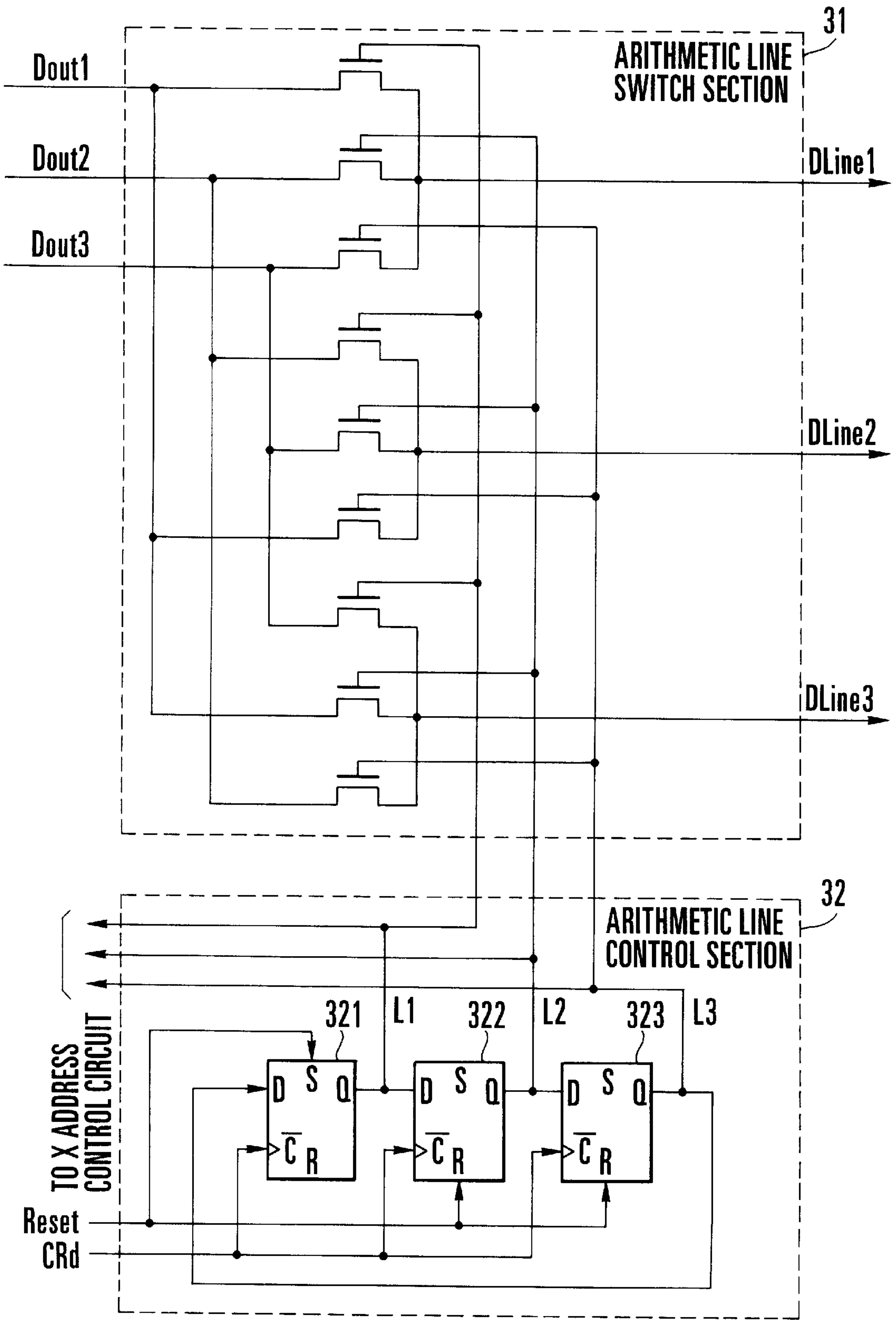
FIG. 14 is a block diagram showing the arrangement of an arithmetic line switch section and an arithmetic line control section.

FIG. 14 shows the arrangement of the arithmetic line switch section and arithmetic line control section. To help understanding, a case wherein analog data are parallelly read out from the three (k=3) nonvolatile semiconductor memories 11 to 13 will be exemplified.

In the arithmetic line control section 32, three latches 321 to 323 are connected in series. Outputs Q from the latches 321 to 323 shift at the trailing edge of the control signal CRd output from one of the nonvolatile semiconductor memories 11 to 13 as a clock.

Hence, only the output Q, i.e., the line shift signal L1 from the latch 321 is activated (high level) in response to the reset signal Reset. One of the line shift signals is activated in response to the subsequently input control signal CRd in the order of L2, L3, L1, . . . every time data from one horizontal line is read out.

The line shift signals L1 to L3 are supplied to the arithmetic line switch section 31 to control switches (FETs). The analog signals Dout read out from the nonvolatile semiconductor memories 11 to 13 are selectively output to predetermined arithmetic line outputs DLine1 to DLine3.

Figure 15:
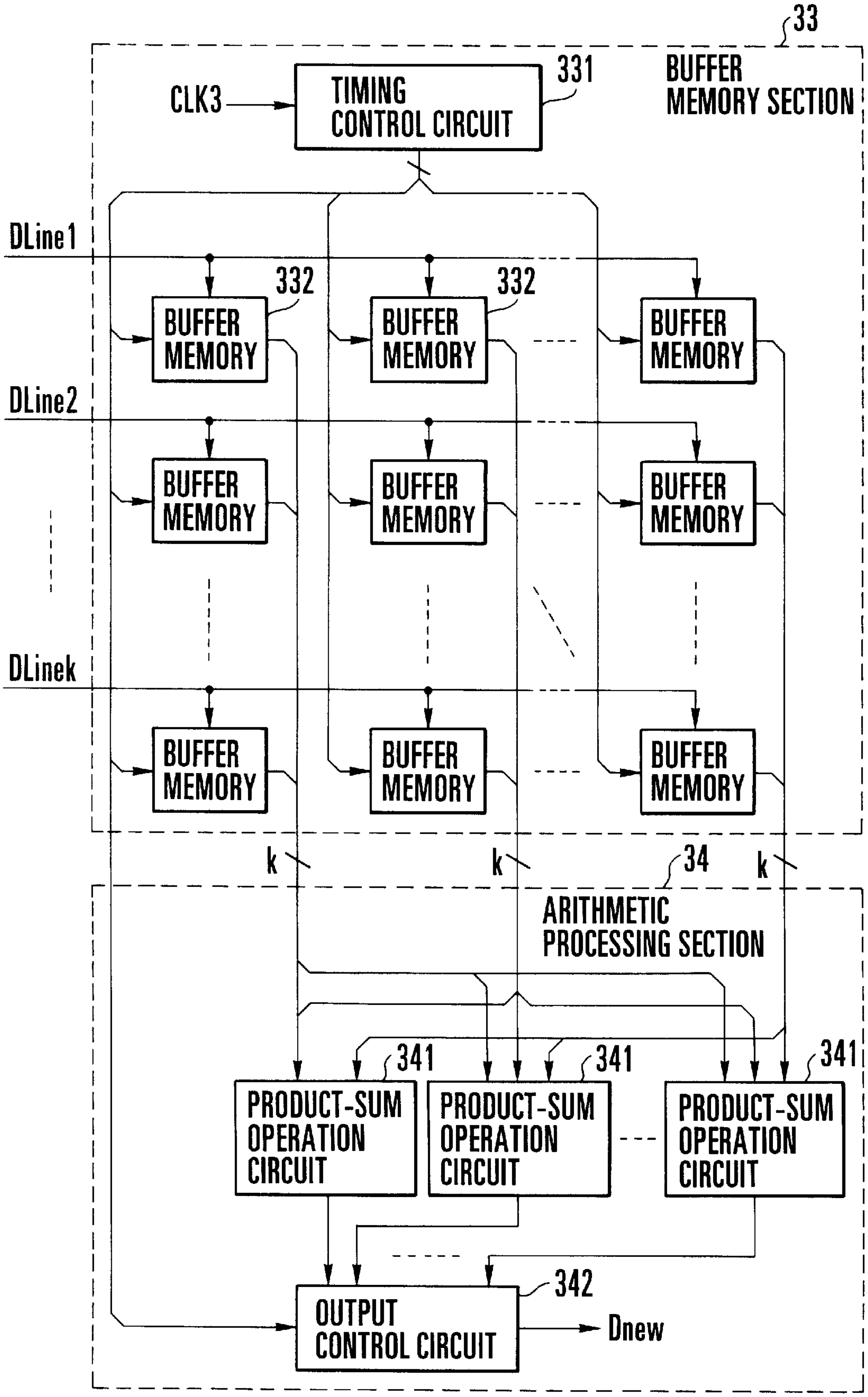
FIG. 15 is a block diagram showing an arrangement of a buffer memory section and an arithmetic processing section.

FIG. 15 shows an arrangement of the buffer memory section and arithmetic processing section. In this example, analog data of k arithmetic line outputs DLine1 to DLinek are processed at a time.

Each of the arithmetic line outputs DLine1 to DLinek has n buffer memories 332. On the basis of a control signal generated from the control signal CLK3 by a timing control circuit 331, each analog data is stored in a corresponding buffer memory 332 and read out at a predetermined timing.

The arithmetic processing section 34 has one or more product-sum operation circuits 341. Each product-sum operation circuit 341 performs product-sum operation of a plurality of analog data which are parallelly read out from predetermined buffer memories 332 in the form of an analog value.

The resultant new analog data are input to an output control circuit 342. One of the analog data is selected at a predetermined timing and output as a new converted analog signal.

The product-sum operation circuit of the arithmetic processing section will be described next in detail.

Figure 16A:
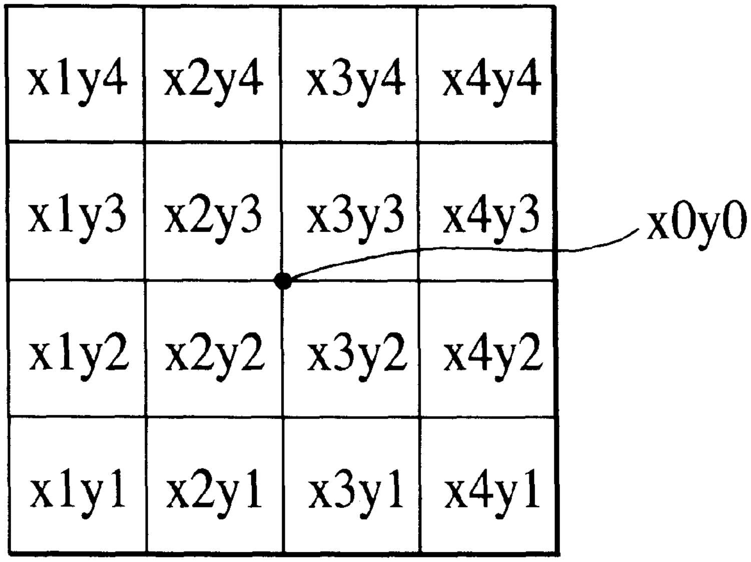
FIGS. 16A and 16B are explanatory views showing an analog convolver used for arithmetic processing.
Figure 16B:
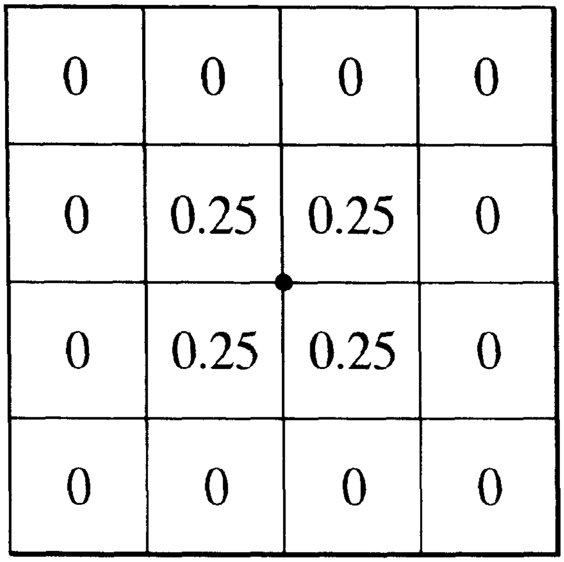

FIGS. 16A and 16B show an analog convolver used for arithmetic processing, in which FIG. 16A shows coordinates, and FIG. 16B shows weights at the coordinates.

An analog convolver performs product-sum operation of the values of a plurality of data around data to be processed on the basis of predetermined weight coefficients to calculate the value of the data to be processed. Selection of appropriate weight coefficients allows various processing operations including simple luminance interpolation and a special filtering effect.

For example, in FIG. 16A, the luminance of a pixel x0y0 to be processed is interpolated from pixels x1y1 to x4y4 around the pixel x0y0 to be processed. The actual luminance of the pixel x0y0 to be processed is calculated by equation (1).

As examples of weight coefficients w11 to w44 for the luminance values of the pixels, in FIG. 16B, the weight coefficients w22, w23, w32, w33 close to the pixel x0y0 to be processed are "0.25", and the remaining weight coefficients are "0". With these weight coefficients, simple interpolation is realized.

$$x0y0 = \sum_{j=1}^{4}\sum_{k=1}^{4} xjyk \cdot wjk \qquad (1)$$

As the weight coefficients, negative weight coefficients may be used. This can be realized by inverting the phases of the signals using a negative power supply or an inverting amplifier.

One application of such an analog convolver is interpolation enlargement processing.

For interpolation enlargement processing, linear interpolation using, as a processing range, pixels immediately on the left and right sides of a pixel to be processed is often performed. If a higher image quality is required, higher-order interpolation can be effectively used, in which the processing range is extended to pixels outside the above range, and approximation is done using a higher-order function.

When this interpolation calculation is performed as digital processing, the number of product-sum operations is twice larger than that of linear interpolation. If this processing is used for image processing, two-dimensional processing is performed, and the number of product-sum operations increases to four times, resulting in a large increase in time required for calculation.

To the contrary, when interpolation is performed by an analog arithmetic circuit using analog data, a plurality of product-sum operations can be processed at a time, and the time required for calculation can be greatly shortened.

Figure 17A:
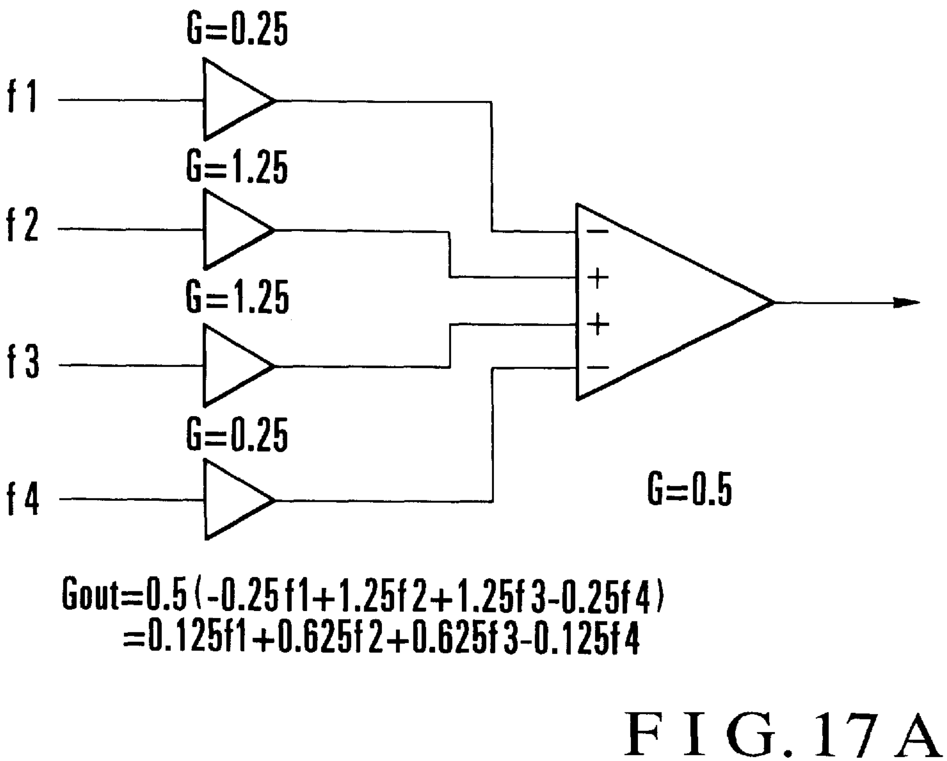
FIGS. 17A and 17B are explanatory views showing a product-sum operation circuit for performing higher-order interpolation.
Figure 17B:
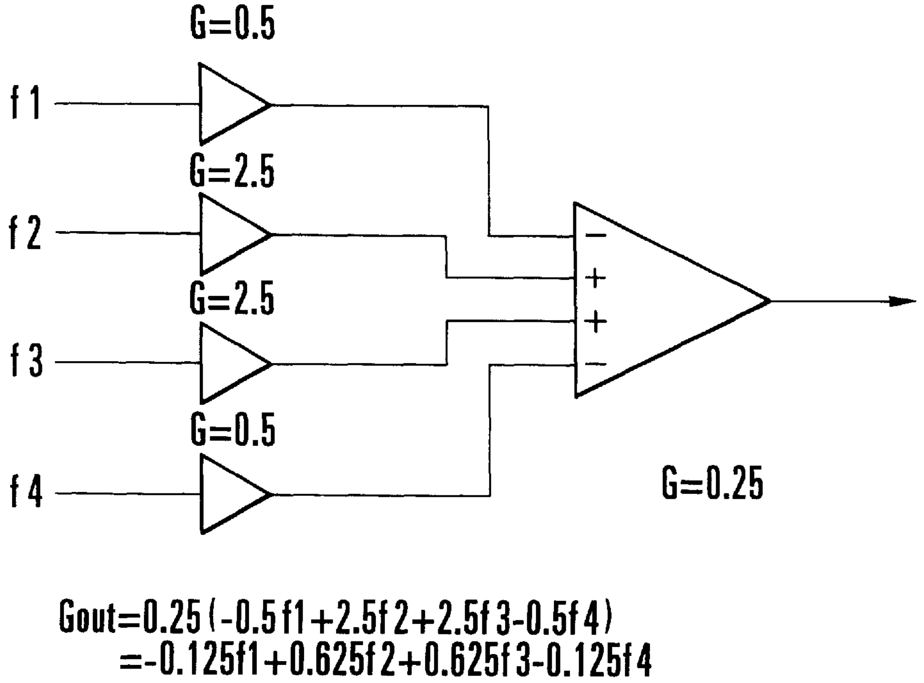

FIGS. 17A and 17B show a product-sum operation circuit for performing higher-order interpolation. This circuit comprises four multipliers (amplifiers) for multiplying (amplifying) analog data f1 to f4 from four horizontal lines by weight coefficients w1 to w4, respectively, and one adder for adding outputs from the multiplier.

Both FIGS. 17A and 17B show weight coefficients for spline interpolation.

Figure 18A:
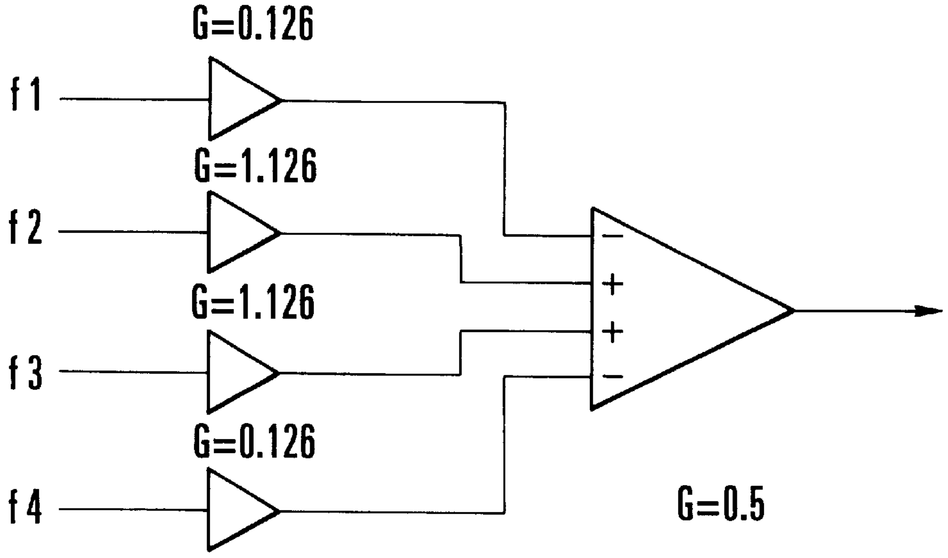
FIGS. 18A and 18B are explanatory views showing another product-sum operation circuit for performing higher-order interpolation.
Figure 18B:
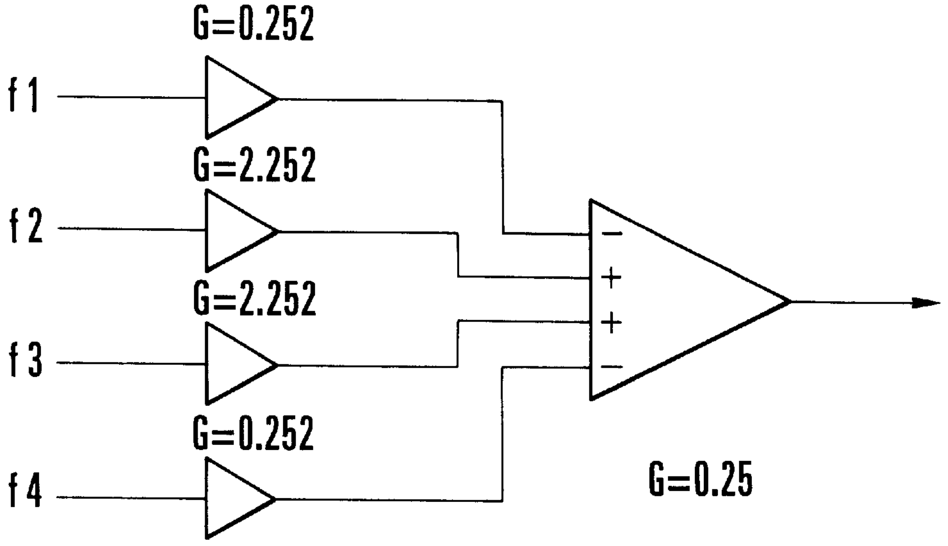

FIGS. 18A and 18B show another product-sum operation circuit for performing higher-order interpolation. Both FIGS. 18A and 18B show weight coefficients for third-order LaGrange interpolation.

For a negative weight coefficient, multiplication is performed by a corresponding multiplier using a positive weight coefficient excluding a negative sign, and the calculation result is input to an inverting input terminal of the adder.

In fact, the weight coefficients correspond to gains G of the multipliers. When the total gain is set to 2 to 4 times, a result with a high S/N ratio can be obtained.

Hence, a weight coefficient for multiplication (division) by the multiplied value of the multipliers is set for the adder, thereby adjusting (attenuating) the upper limit of the added analog data.

An analog convolver can also be applied to filter processing.

Figures 19A, 19B:
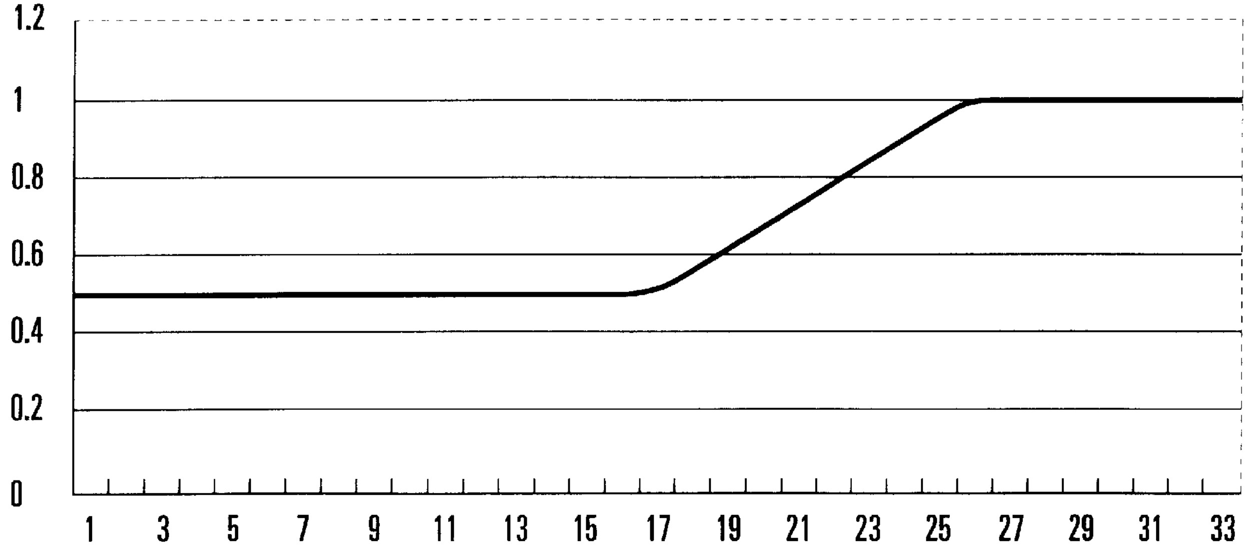
FIGS. 19A and 19B are explanatory views showing filter processing.

FIGS. 19A and 19B show filter processing, in which FIG. 19A shows the weight coefficients for pixels, and FIG. 19B shows filter characteristics.

In this case, a pixel matrix consisting of 5×5 pixels around a pixel to be processed is set as the arithmetic processing range.

Normally, the arithmetic processing range is determined from required frequency characteristics. In an application to image processing, no very steep frequency characteristics are required, and a 3×3 to 7×7 pixel matrix suffices.

In FIG. 19B, the abscissa represents the relative frequency, and the ordinate represents the relative intensity.

On the abscissa, "1" indicates a DC component, and "33" at the right end indicates the highest frequency (relative value).

FIG. 19B shows relative values because the absolute value of the highest frequency changes depending on the highest frequency component contained in an image to be processed.

Interpolation for the image signal shown in FIGS. 12A and 12B will be described next in detail with reference to FIGS. 20 to 24.

Figure 20:
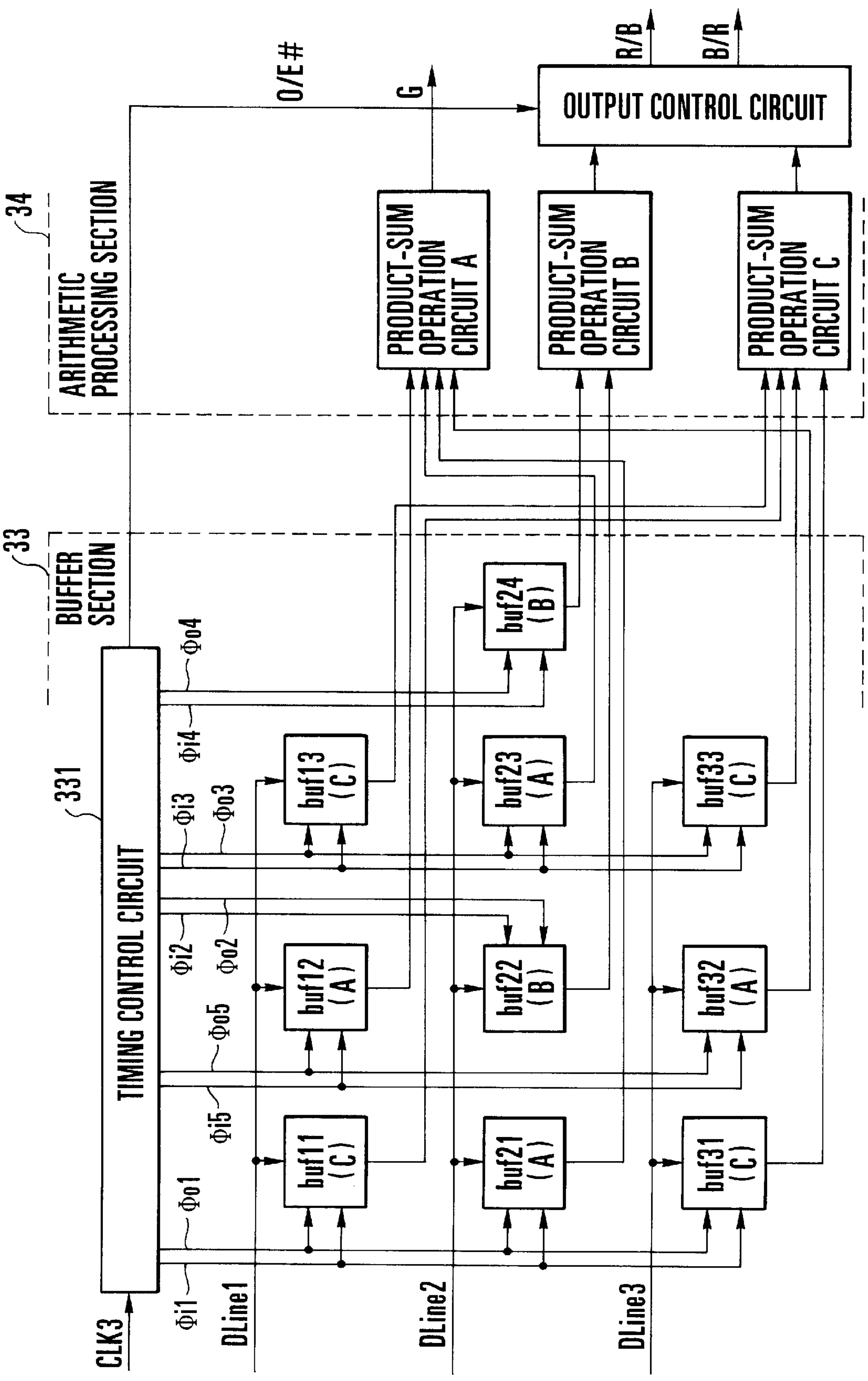
FIG. 20 is a block diagram showing another arrangement of the buffer memory section and arithmetic processing section.

FIG. 20 shows another arrangement of the buffer memory section and arithmetic processing section. In this example, RGB signals are generated by linear interpolation using a 3×3 pixel matrix.

The arrangement shown in FIG. 14 is applied as the arrangement of the arithmetic line switch section 31 and arithmetic line control section 32.

A plurality of buffer memories buf11 to buf33 for holding and outputting analog data are connected to the arithmetic line outputs DLine1 to DLine3.

The luminance values (analog data) at the pixel positions shown in FIG. 12B are stored in the buffer memories buf11 to buf33 on the basis of control signals øi1 to øi5 from the timing control circuit 331, and read out at timings based on control signals øo1 to øo5.

Figure 21:
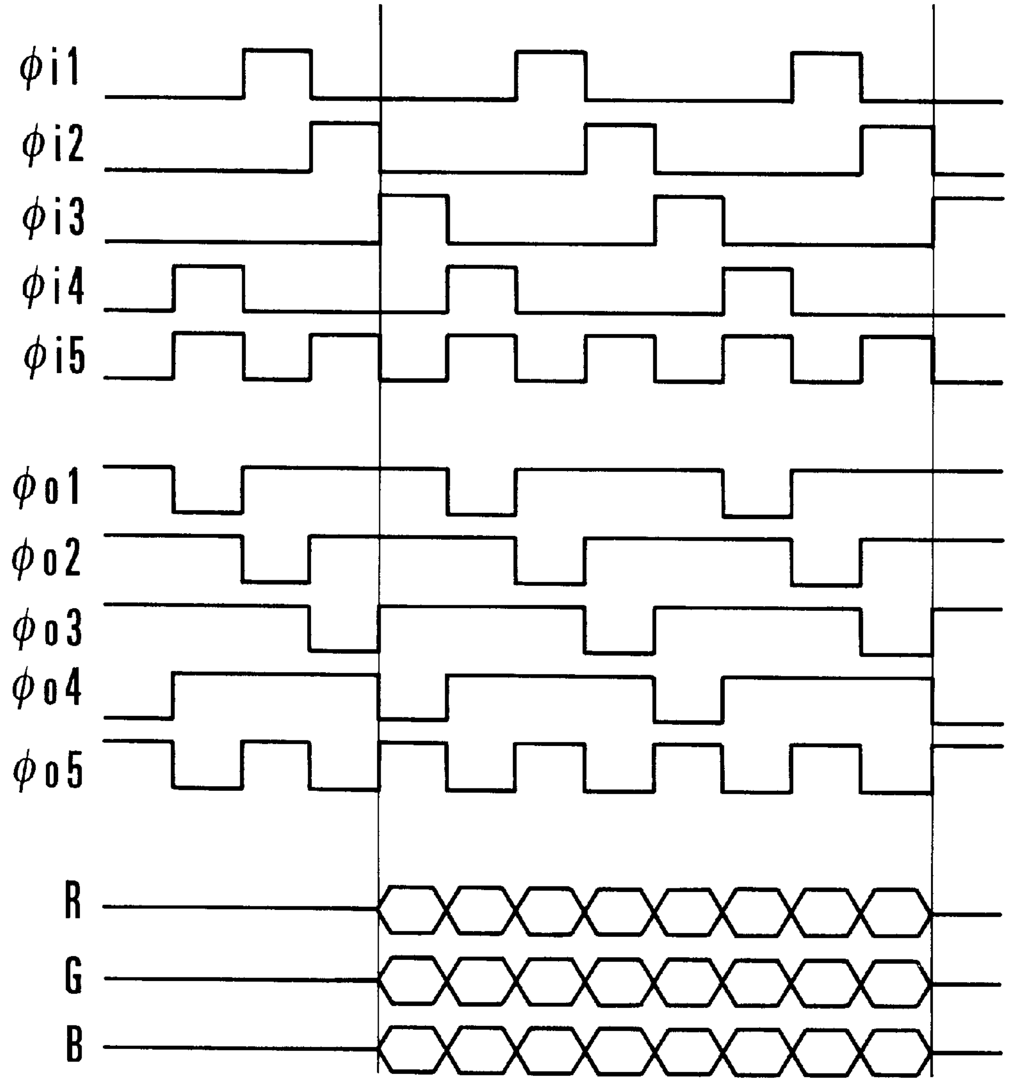
FIG. 21 is a timing chart showing the write/read operation for buffer memories.

FIG. 21 shows the write/read timing for the buffer memories.

Figure 22:
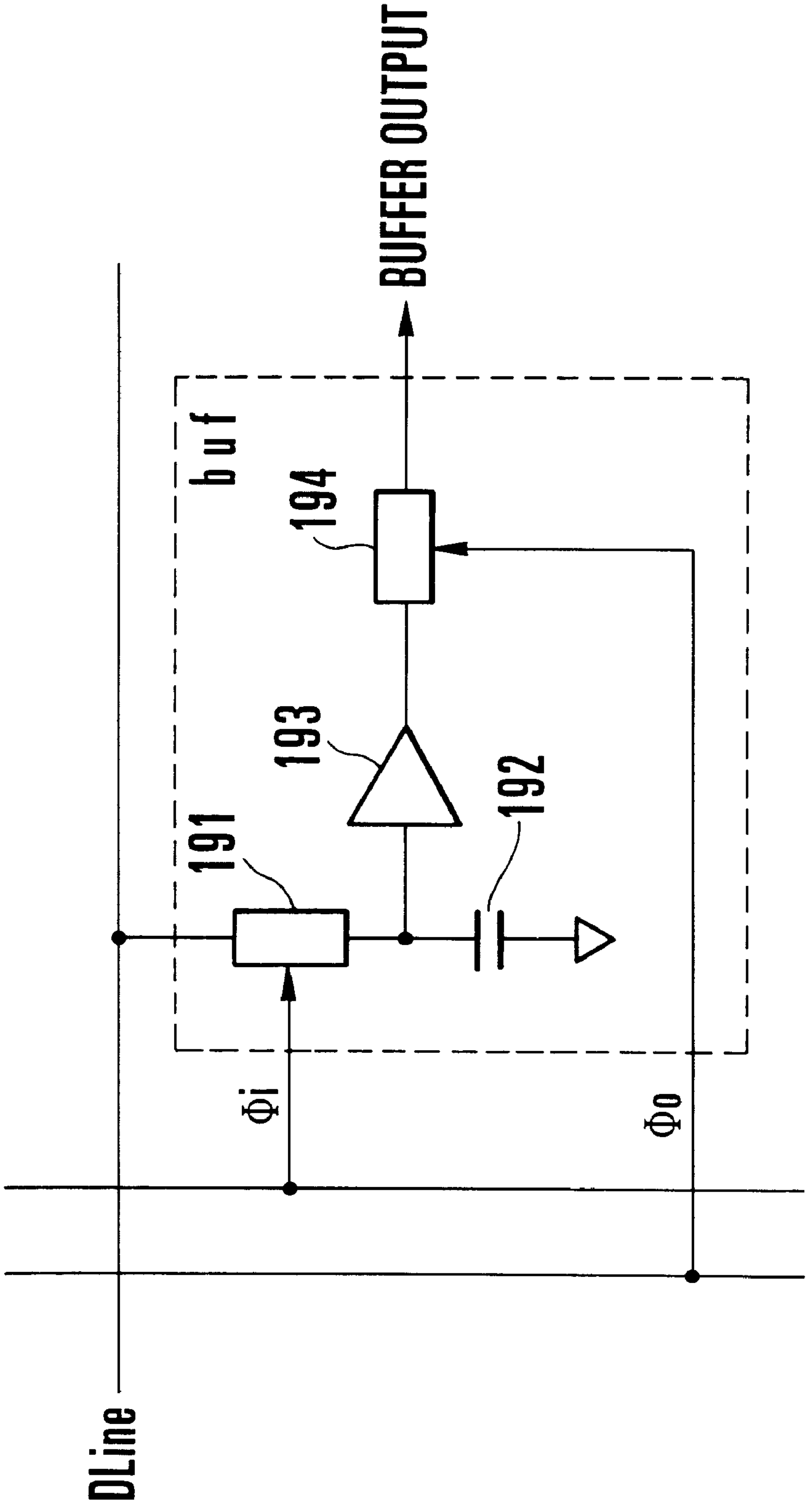
FIG. 22 is a block diagram showing the arrangement of a buffer memory.

FIG. 22 shows the arrangement of a buffer memory.

The amplitude value from the arithmetic line output DLine is stored in a capacitive element 192 through a switch 191 controlled on the basis of a signal øi as analog data.

This analog data is output from a buffer element 193 at a low impedance and output from the circuit through a switch 194 controlled by a signal øo.

Figure 23A:
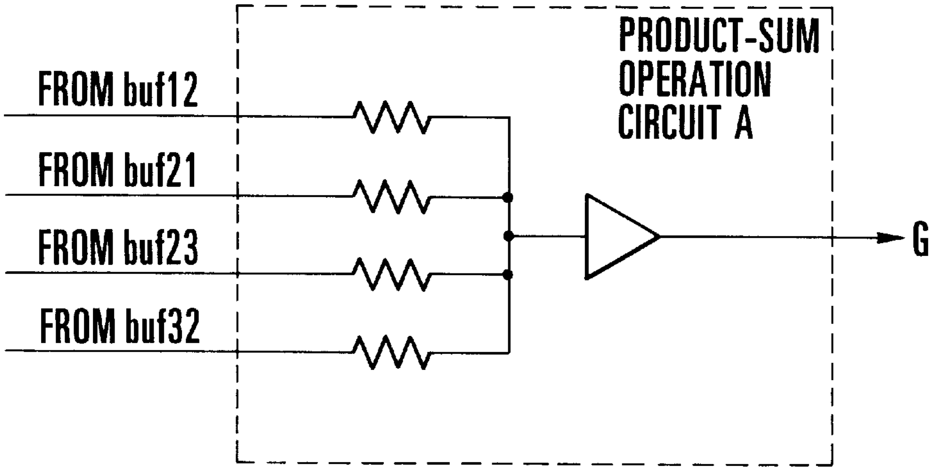
FIGS. 23A, 23B, and 23C are explanatory views showing arrangements of product-sum operation circuits using resistance matrices.
Figure 23B:
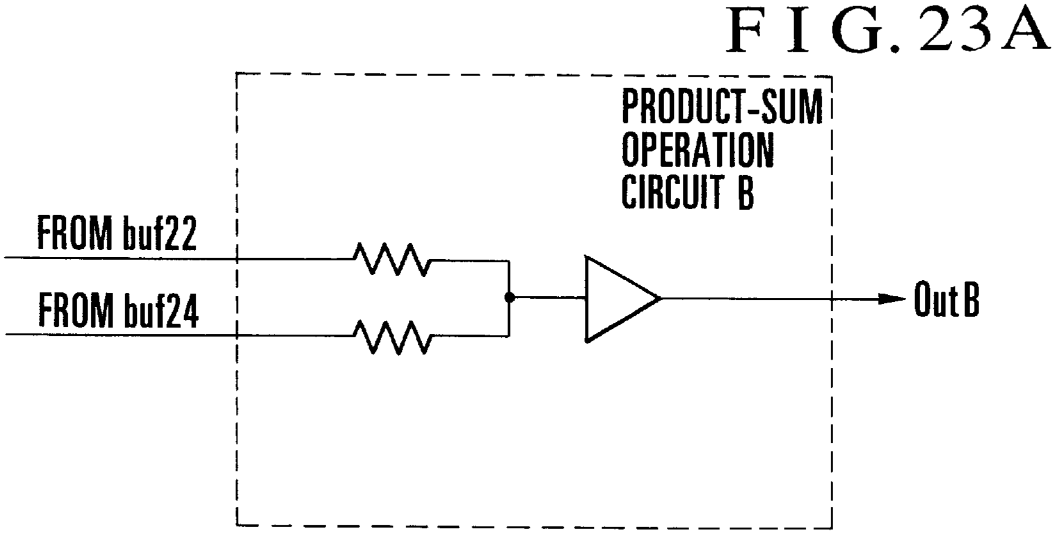
Figure 23C:
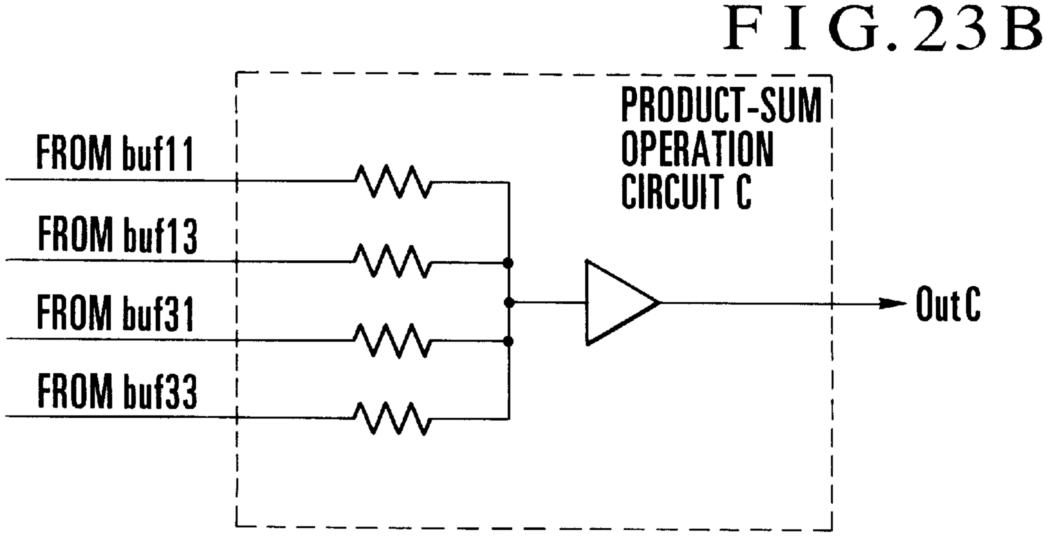

FIGS. 23A, 23B, and 23C show arrangements of product-sum operation circuits using resistance matrices.

In a product-sum operation circuit A shown in FIG. 23A, outputs from buffer memories buf12, buf21, buf23, and buf32 are added through a resistance circuit comprising a plurality of resistance elements and output from the buffer element as a G (green) interpolated luminance value.

In a product-sum operation circuit B shown in FIG. 23B, outputs from buffer memories buf22 and buf24 are added through a resistance circuit and output from the buffer element as an R (red) or B (blue) interpolated luminance value OutB.

In a product-sum operation circuit C shown in FIG. 23C, outputs from buffer memories buf11, buf13, buf31, and buf33 are added through a resistance circuit and output from the buffer element as an R (red) or B (blue) interpolated luminance value OutC.

For simple linear interpolation, these resistance elements need have the same resistance value only in each product-sum operation circuit, and the resistance value is determined in consideration of the gain of the buffer element.

Figure 24:
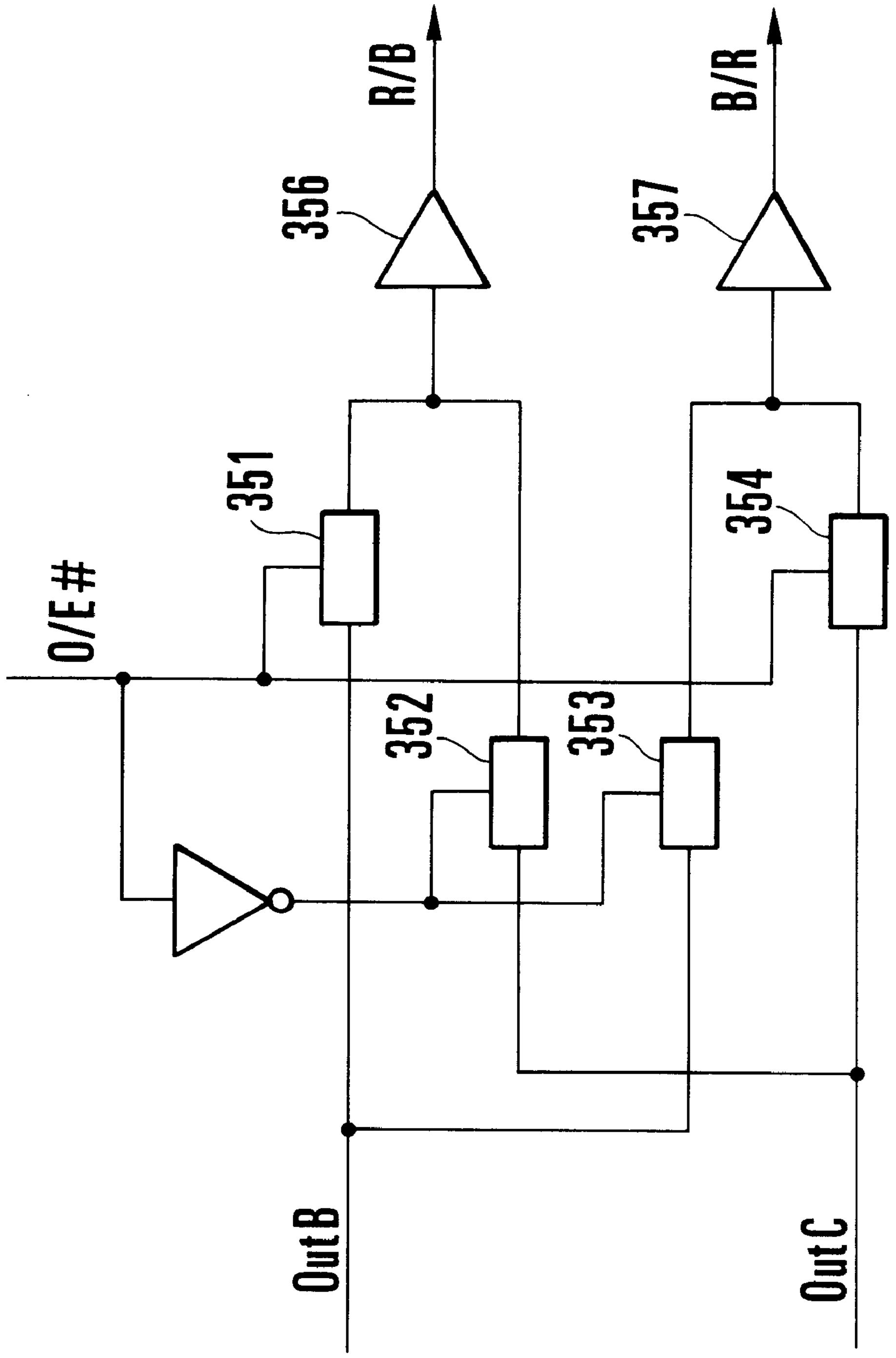
FIG. 24 is an explanatory view showing the arrangement of the output control circuit of the arithmetic processing section.

FIG. 24 shows the arrangement of the output control circuit of the arithmetic processing section.

In the Bayer matrix shown in FIGS. 12A and 12B, B and R outputs alternately change depending on a horizontal line to be processed.

In the output control circuit, switches 351 to 354 are controlled by a control signal O/E# representing an odd- or even-numbered horizontal line and its inverting logic (inverter 355) to switch the outputs from the product-sum operation circuits B and C and output them as B or R interpolated luminance values from buffer elements 356 and 357.

For switching between odd- and even-numbered lines, the reference clock signal for the clock signals øi and øo is input with a shift corresponding to one clock pulse of the clock signals øi and øo.

As the resistance circuit in each of the product-sum operation circuits shown in FIGS. 23A to 23C, the following structure may be used. A resistor made of impurity diffusion layers or high-resistance interconnection layers having a predetermined width and length is formed on a semiconductor substrate. The analog data are input to a plurality of input electrodes attached to predetermined positions on the resistor, and the calculation result (voltage division ratio) is obtained from an output electrode attached to a predetermined position. In this case, a product-sum operation circuit can be constructed with a very simple arrangement.

The gains of the multipliers shown in FIGS. 17A, 17B, 18A, and 18B may be changed.

In this case, a variable gain amplifier capable of changing the gain, e.g., a Gilbert circuit, can be used as a multiplier.

With this arrangement, different processing effects can be realized by one circuit.

In the above description, luminance between pixels is interpolated. Conversely, thinning may be performed.

To do this, data are stored in the buffer memories at a longer period than that of the read clock CLK3.

When data are converted into RGB signals, passed through a low-pass filter, and then sampled again at a longer period than that of the read clock, a fine thinned image can be obtained.

In the above description, as an analog data reading method, data are serially read out the nonvolatile semiconductor memory sections. However, a plurality of desired analog data to be used for arithmetic processing may be parallelly read out from the nonvolatile semiconductor memory sections.

With this arrangement, the number of memory buffers for temporarily storing readout analog data can be reduced.

Considering versatility for the input analog signal, when a number of nonvolatile semiconductor memory sections are used, analog data need not be parallelly read out from all nonvolatile semiconductor memory sections. Analog data may be parallelly read out from nonvolatile semiconductor memory sections in number necessary for arithmetic processing, e.g., ½ the nonvolatile semiconductor memory sections.

As described above, according to the present invention, a plurality of nonvolatile semiconductor memory sections are parallelly arranged in correspondence with an input analog signal. Each analog data is stored in one nonvolatile semiconductor memory section. After this, the plurality of analog data are read out, and predetermined analog arithmetic processing is performed to generate new analog data. This data is output as a new analog signal.

A number of relatively complex analog calculations can be simultaneously processed at a time. Hence, the throughput of signal conversion processing can be improved as compared to the prior art in which an analog signal is quantized into digital data, and digital arithmetic processing is performed for the resultant digital data using an MPU or a DSP to generate a desired signal.

In addition, since neither expensive A/D converter with a large bit width nor MPU or DSP capable of highly accurate arithmetic processing need be used to reduce quantization noise, highly accurate signal conversion processing can be realized at relatively low cost.

What is claimed is:

1. A signal conversion processing apparatus for temporarily storing an input analog signal and processing the signal to generate a desired output signal, comprising:

a plurality of nonvolatile semiconductor memory sections for sequentially storing the input analog signal on the basis of a predetermined first control signal in the form of an analog value;

an input control section for selecting a nonvolatile semiconductor memory section, in which the analog signal is to be written, from said nonvolatile semiconductor memory sections on the basis of a predetermined second control signal; and a signal processing section for performing arithmetic processing of a plurality of analog data read out from said nonvolatile semiconductor memory sections to convert the analog data into a desired output signal in the form of an analog value.

2. An apparatus according to claim 1, wherein said signal processing section performs arithmetic processing on the basis of j (j is an integer: $j \geqq k$) analog data read out from k (k is an integer: $k \geqq 2$) different nonvolatile semiconductor memory sections.

3. An apparatus according to claim 2, wherein said apparatus further comprises at least one buffer for individually holding the analog data read out from said nonvolatile semiconductor memory section, and said signal processing section performs arithmetic processing of analog data held by at least two buffers in the form of an analog value.

4. An apparatus according to claim 2, wherein said signal processing section performs arithmetic processing of analog data substantially simultaneously read out from at least two nonvolatile semiconductor memory sections in the form of an analog value.

5. An apparatus according to claim 1, wherein said signal processing section comprises an analog product-sum operation circuit for receiving a plurality of analog data.

6. An apparatus according to claim 5, wherein said analog product-sum operation circuit comprises a plurality of amplifiers arranged in units of input analog data to amplify the corresponding analog data by arbitrary gains, and an adder for adding outputs from said amplifiers.

7. An apparatus according to claim 6, wherein each of said amplifiers comprises a variable gain amplification circuit capable of changing the gain.

8. An apparatus according to claim 5, wherein said analog product-sum operation circuit comprises a resistance circuit having a plurality of resistance elements each having one terminal for receiving analog data and the other terminal commonly connected, and an amplifier for outputting an output from the other terminal of said resistance circuit.

9. An apparatus according to claim 8, wherein said resistance circuit comprises a resistor formed from a plurality of impurity diffusion layers or high-resistance interconnection layers having a predetermined width and length and formed on a semiconductor substrate, a plurality of input electrodes formed at predetermined positions on said resistor to receive analog data, and an output electrode formed at a predetermined position on said resistor to output a calculation result of the analog data.

10. An apparatus according to claim 1, wherein when an image signal representing luminance of each pixel of an image is input as the analog signal, a horizontal sync signal of the image signal is used as the first control signal, and a vertical sync signal of the image signal is used as the second control signal.

* * * * *